(12) United States Patent
Tsuduki et al.

(10) Patent No.: US 9,220,172 B2
(45) Date of Patent: Dec. 22, 2015

(54) ELECTRONIC COMPONENT, ELECTRONIC MODULE, THEIR MANUFACTURING METHODS, MOUNTING MEMBER, AND ELECTRONIC APPARATUS

(71) Applicant: CANON KABUSHIKI KAISHA, Tokyo (JP)

(72) Inventors: Koji Tsuduki, Kawasaki (JP); Takanori Suzuki, Tokyo (JP); Tadashi Kosaka, Atsugi (JP); Yasuhiro Matsuki, Atsugi (JP); Shin Hasegawa, Hadano (JP); Fujio Ito, Yokohama (JP); Hisatane Komori, Ayase (JP); Yasushi Kurihara, Komae (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 13/869,829

(22) Filed: Apr. 24, 2013

(65) Prior Publication Data

US 2013/0286565 A1    Oct. 31, 2013

(30) Foreign Application Priority Data

Apr. 27, 2012  (JP) ................................. 2012-103828
Feb. 28, 2013  (JP) ................................. 2013-039449

(51) Int. Cl.
*H05K 5/00*    (2006.01)
*H05K 7/02*    (2006.01)
(Continued)

(52) U.S. Cl.
CPC ............ *H05K 5/0091* (2013.01); *H01L 23/057* (2013.01); *H01L 23/10* (2013.01);
(Continued)

(58) Field of Classification Search
CPC ..................... H05K 1/0271; H05K 2201/068
USPC ........................ 361/679.01; 29/829, 841, 846
See application file for complete search history.

(56) References Cited

U.S. PATENT DOCUMENTS

| 3,622,419 A | 11/1971 | London et al. |
| 4,604,677 A | 8/1986 | Suzuki et al. |

(Continued)

FOREIGN PATENT DOCUMENTS

| CN | 1160984 A | 10/1997 |
| CN | 1227411 A | 9/1999 |

(Continued)

OTHER PUBLICATIONS

U.S. Appl. No. 13/869,779, filed Apr. 24, 2013, Koji Tsuduki.

(Continued)

*Primary Examiner* — Jeremy C Norris
*Assistant Examiner* — Nathan Milakovich
(74) *Attorney, Agent, or Firm* — Canon U.S.A., Inc. IP Division

(57) ABSTRACT

A method of manufacturing an electronic component includes a first step of preparing a mounting member formed by bonding a peripheral region of a base body having an outer terminal connected with a wiring member, and a frame body, while heating the base body and the frame body; a second step of fixing the electronic device to the base body; and a third step of bonding the lid body and the frame body. A condition $\alpha_L$, $\alpha_F$, $\alpha_B < \alpha_C$ is satisfied, where $\alpha_L$ is a thermal expansion coefficient of the lid body, $\alpha_F$ is a thermal expansion coefficient of the frame body, $\alpha_B$ is a thermal expansion coefficient of the base body, and $\alpha_C$ is a thermal expansion coefficient of the wiring member.

20 Claims, 10 Drawing Sheets

(51) Int. Cl.
  *H05K 13/04*    (2006.01)
  *H01L 23/057*   (2006.01)
  *H01L 23/10*    (2006.01)

(52) U.S. Cl.
  CPC ..... *H05K 13/04* (2013.01); *H01L 2224/32225* (2013.01); *H01L 2224/48091* (2013.01); *H01L 2224/48227* (2013.01); *H01L 2224/49171* (2013.01); *H01L 2224/73265* (2013.01); *H01L 2224/92247* (2013.01); *Y10T 29/49117* (2015.01)

(56) References Cited

U.S. PATENT DOCUMENTS

| | | | | |
|---|---|---|---|---|
| 5,195,023 | A * | 3/1993 | Manzione et al. | 361/728 |
| 5,200,367 | A | 4/1993 | Ko | |
| 5,458,716 | A | 10/1995 | Alfaro et al. | |
| 5,481,136 | A * | 1/1996 | Kohmoto et al. | 257/712 |
| 5,744,863 | A | 4/1998 | Culnane | |
| 5,828,127 | A | 10/1998 | Yamagata et al. | |
| 6,011,697 | A * | 1/2000 | Budnaitis et al. | 361/792 |
| 6,268,231 | B1 * | 7/2001 | Wetzel | 438/48 |
| 6,611,056 | B2 | 8/2003 | Okamoto et al. | |
| 6,906,412 | B2 | 6/2005 | Furukubo et al. | |
| 6,953,891 | B2 | 10/2005 | Bolken et al. | |
| 6,979,595 | B1 * | 12/2005 | James et al. | 438/115 |
| 7,417,198 | B2 | 8/2008 | Betz et al. | |
| 7,646,094 | B2 | 1/2010 | Suminoe | |
| 8,053,953 | B2 * | 11/2011 | Yamada | 310/348 |
| 8,058,720 | B2 * | 11/2011 | Chen et al. | 257/691 |
| 8,217,556 | B2 | 7/2012 | Yamada | |
| 8,243,461 | B2 * | 8/2012 | Uchida et al. | 361/760 |
| 8,816,574 | B2 | 8/2014 | Yamada | |
| 8,823,248 | B2 | 9/2014 | Yamada | |
| 2002/0020916 | A1 | 2/2002 | Ito | |
| 2003/0161109 | A1 | 8/2003 | Kurihaka | |
| 2004/0046247 | A1 | 3/2004 | Tower | |
| 2004/0177984 | A1 * | 9/2004 | Groothuis et al. | 174/52.4 |
| 2005/0174469 | A1 | 8/2005 | Cho | |
| 2007/0200053 | A1 | 8/2007 | Nomura | |
| 2008/0132002 | A1 | 6/2008 | Inao et al. | |
| 2008/0134631 | A1 | 6/2008 | Kuboi | |
| 2008/0292308 | A1 | 11/2008 | Iwabuchi | |
| 2009/0230486 | A1 | 9/2009 | Shinmodaira | |
| 2010/0171397 | A1 | 7/2010 | Yamada | |
| 2010/0315938 | A1 * | 12/2010 | Ascanio et al. | 369/126 |
| 2012/0187803 | A1 | 7/2012 | Yamada | |
| 2013/0001398 | A1 * | 1/2013 | Wada et al. | 250/206.1 |
| 2013/0105205 | A1 | 5/2013 | Takagi | |
| 2013/0214405 | A1 * | 8/2013 | Bauer et al. | 257/692 |
| 2013/0241364 | A1 | 9/2013 | Yamada | |
| 2013/0242524 | A1 * | 9/2013 | Chan | 361/813 |
| 2014/0237805 | A1 * | 8/2014 | Suzuki et al. | 29/592.1 |
| 2014/0240588 | A1 * | 8/2014 | Sakuragi et al. | 348/373 |
| 2014/0252569 | A1 | 9/2014 | Ikuma et al. | |
| 2014/0268594 | A1 * | 9/2014 | Wang et al. | 361/749 |
| 2014/0306582 | A1 | 10/2014 | Matsuzawa et al. | |
| 2015/0116946 | A1 * | 4/2015 | Katase et al. | 361/713 |

FOREIGN PATENT DOCUMENTS

| | | |
|---|---|---|
| CN | 1461053 A | 12/2003 |
| CN | 1691344 A | 11/2005 |
| CN | 101312206 A | 11/2008 |
| CN | 101853827 A | 10/2010 |
| GB | 2007911 A | 5/1979 |
| JP | S62-217640 A | 9/1987 |
| JP | S62-273768 A | 11/1987 |
| JP | H02-291153 A | 11/1990 |
| JP | 4-123462 A | 4/1992 |
| JP | H09-283664 A | 10/1997 |
| JP | 11354587 A | 12/1999 |
| JP | 2001-168443 A | 6/2001 |
| JP | 2001-308442 A | 11/2001 |
| JP | 2002-299486 A | 10/2002 |
| JP | 2003-101042 A | 4/2003 |
| JP | 2006-245090 A | 9/2006 |
| JP | 2007-208045 A | 8/2007 |
| JP | 2007-242908 A | 9/2007 |
| JP | 2008-245244 A | 10/2008 |
| JP | 2011-077080 A | 4/2011 |
| JP | 2011-165745 A | 8/2011 |
| RU | 2198949 C2 | 2/2003 |
| RU | 2322729 C1 | 4/2008 |
| WO | 2004/064120 A2 | 7/2004 |
| WO | 2011043493 A1 | 4/2011 |
| WO | 2013-118501 A1 | 8/2013 |

OTHER PUBLICATIONS

U.S. Appl. No. 13/869,852, filed Apr. 24, 2013, Koji Tsuduki.

* cited by examiner

FIG. 8A
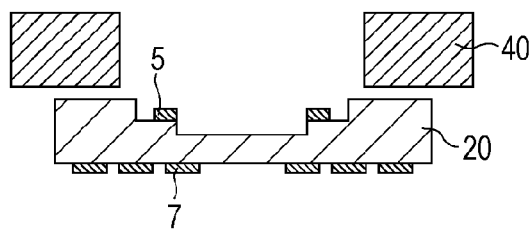
FIG. 8B
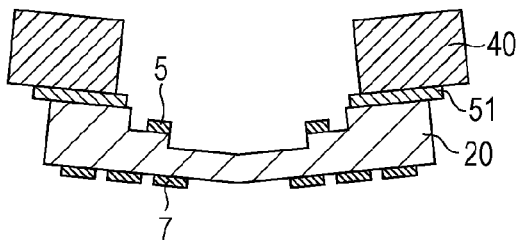
FIG. 8C
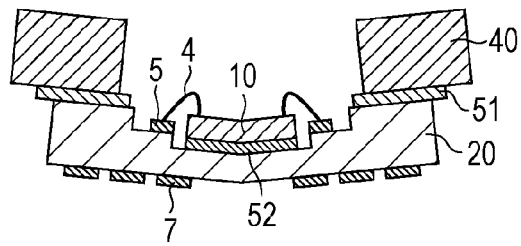
FIG. 8D
FIG. 8E
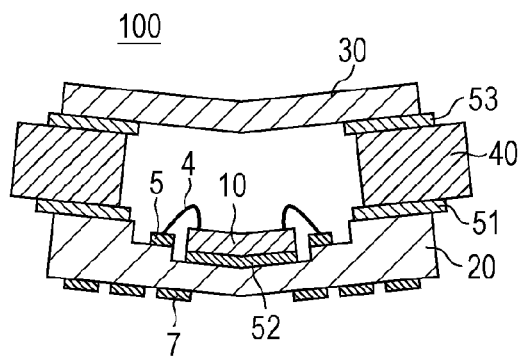
FIG. 8F
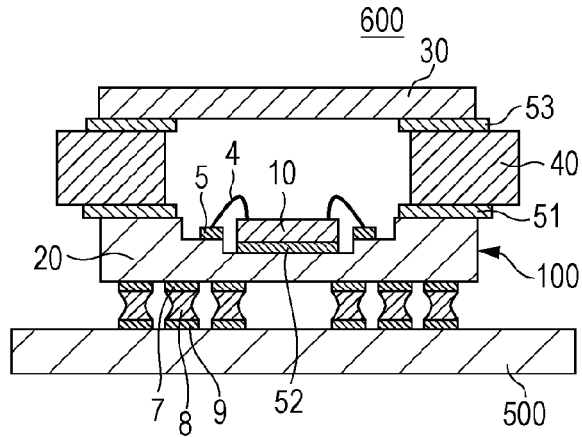
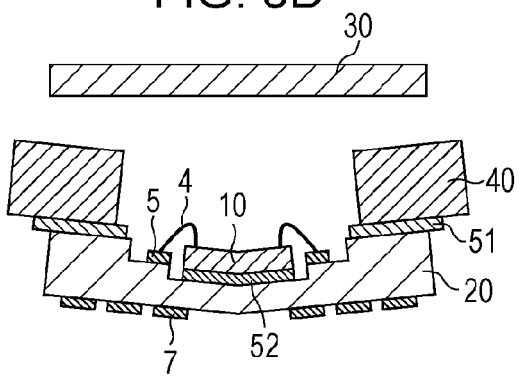

FIG. 9A
FIG. 9B
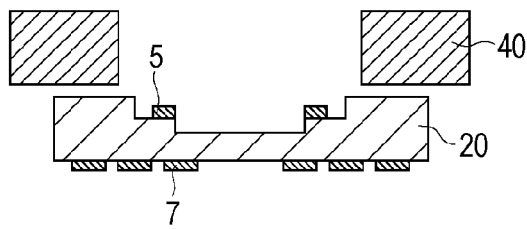
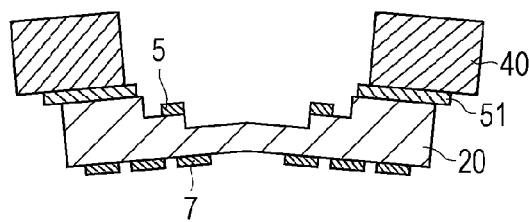
FIG. 9C
FIG. 9D
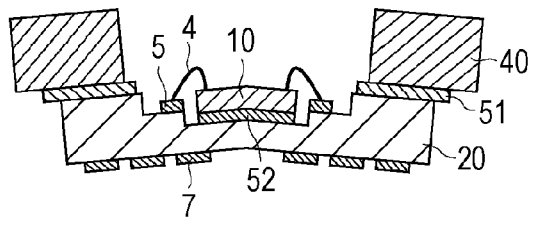
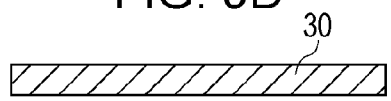
FIG. 9E
FIG. 9F
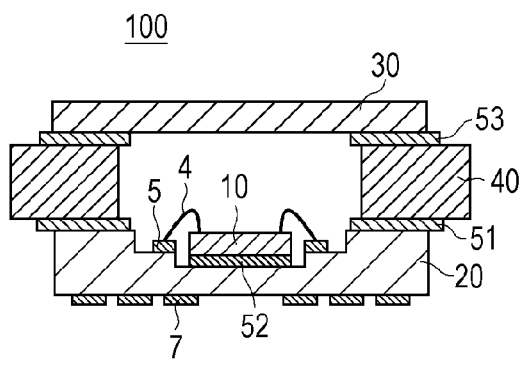
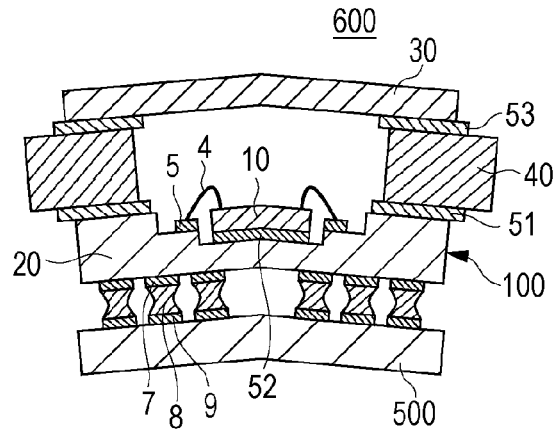

ELECTRONIC COMPONENT, ELECTRONIC MODULE, THEIR MANUFACTURING METHODS, MOUNTING MEMBER, AND ELECTRONIC APPARATUS

BACKGROUND OF THE INVENTION

1. Field of the Invention

The present disclosure relates to an electronic component formed of materials with different thermal expansion coefficients.

2. Description of the Related Art

Japanese Patent Laid-Open No. 2003-101042 discloses a package for housing an optical semiconductor device including an insulating base body, a metal frame body, and a light-transmissive lid body.

When the package of Japanese Patent Laid-Open No. 2003-101042 is mounted on an external electric circuit board, if a heating step that increases temperatures of the package and the circuit board is performed, deformation (warping) may occur at the package and the circuit board, in accordance with the relationship between thermal expansion coefficients of the package and the circuit board. If this heating step is a reflow soldering step, the warping may cause defective soldering to occur. Also, if controllability of coplanarity of an element is decreased due to the warping, the performance of the element may not be sufficiently provided.

SUMMARY OF THE INVENTION

Accordingly, the present invention provides at least an electronic component that can reduce an influence of deformation with heat.

According to a first aspect of this disclosure, a manufacturing method of an electronic component is provided. The electronic component includes an electronic device, and a package having an inner terminal that is electrically connected with the electronic device and an outer terminal electrically continued from the inner terminal and is to be fixed to a wiring member by reflow soldering. The method includes a first step of preparing a mounting member, the mounting member being formed by bonding a base body having a center region and a peripheral region that encloses the center region, and a frame body having an opening corresponding to the center region, at the peripheral region of the base body, the mounting member having an inner terminal and an outer terminal that is electrically continued from the inner terminal; a second step of fixing an electronic device to the center region of the base body and electrically connecting the inner terminal with the electronic device; and a third step of arranging a lid body having a center region and a peripheral region that encloses the center region so that the center region of the lid body faces the electronic device, and bonding the peripheral region of the lid body and the frame body. A condition $\alpha_B < \alpha_F < \alpha_C$, and a condition $\alpha_L < \alpha_C$ are satisfied, where $\alpha_L$ is a thermal expansion coefficient of the lid body, $\alpha_F$ is a thermal expansion coefficient of the frame body, $\alpha_B$ is a thermal expansion coefficient of the base body, and $\alpha_C$ is a thermal expansion coefficient of the wiring member.

According to a second aspect of this disclosure, a manufacturing method of an electronic component is provided. The electronic component includes an electronic device, a package having an inner terminal that is electrically connected with the electronic device and an outer terminal that is electrically continued from the inner terminal and is to be fixed to a wiring member by reflow soldering, and a lid body having a center region that faces the electronic device with a space interposed therebetween and a peripheral region that encloses the center region. The method includes a first step of preparing a mounting member, the mounting member being formed by bonding a base body having a center region and a peripheral region that encloses the center region, and a frame body having an opening corresponding to the center region, at the peripheral region of the base body, the mounting member having an inner terminal and an outer terminal that is electrically continued from the inner terminal; a second step, after the first step, of fixing an electronic device to the center region of the base body and electrically connecting the inner terminal with the electronic device; and a third step, after the second step, of arranging a lid body having a center region and a peripheral region that encloses the center region so that the center region of the lid body faces the electronic device, and bonding the peripheral region of the lid body and the frame body. One of conditions (a) and (b) is satisfied, the conditions (a) and (b) including $$\alpha_B < \alpha_F < \alpha_C, \text{ and } \alpha_L < \alpha_F < \alpha_C, \tag{a}$$

and $$\alpha_F < \alpha_B < \alpha_C, \text{ and } \alpha_F < \alpha_L < \alpha_C, \tag{b}$$

where $\alpha_L$ is a thermal expansion coefficient of the lid body, $\alpha_F$ is a thermal expansion coefficient of the frame body, $\alpha_B$ is a thermal expansion coefficient of the base body, and $\alpha_C$ is a thermal expansion coefficient of the wiring member.

According to a third aspect of this disclosure, a manufacturing method of an electronic module includes fixing an electronic component that is manufactured by the above-described manufacturing method of the electronic component, to a wiring member by reflow soldering.

According to a fourth aspect of this disclosure, a mounting member includes an inner terminal electrically connected with an electronic device; an outer terminal that is electrically continued from the inner terminal and is to be fixed to a wiring member; a base body having a center region at which the electronic device is to be arranged, and a peripheral region that encloses the center region; and a frame body having an opening corresponding to the center region of the base body and being bonded to the peripheral region of the base body. The frame body has a higher thermal expansion coefficient than a thermal expansion coefficient of the base body.

According to a fifth aspect of this disclosure, an electronic component includes the above-described mounting member; an electronic device that is fixed to the center region of the base body and is electrically connected with the inner terminal; and a lid body having a center region that faces the electronic device, and a peripheral region that encloses the center region and is bonded to the frame body. The electronic device has a lower thermal expansion coefficient than the thermal expansion coefficient of the base body, the thermal expansion coefficient of the frame body, and a thermal expansion coefficient of the lid body.

According to a sixth aspect of this disclosure, an electronic module includes the above-described electronic component; and a wiring member to which the outer terminal is fixed. The thermal expansion coefficient of the base body, the thermal expansion coefficient of the frame body, and the thermal expansion coefficient of the lid body are lower than a thermal expansion coefficient of the wiring member.

According to a seventh aspect of this disclosure, an electronic apparatus includes the above-described electronic module; and a housing that houses the electronic module.

Further features of the present invention will become apparent from the following description of exemplary embodiments with reference to the attached drawings.

BRIEF DESCRIPTION OF THE DRAWINGS

FIGS. 8A to 8F are schematic sectional views explaining warping.

FIGS. 9A to 9F are schematic sectional views explaining warping.

DESCRIPTION OF THE EMBODIMENTS

Figure 1A:
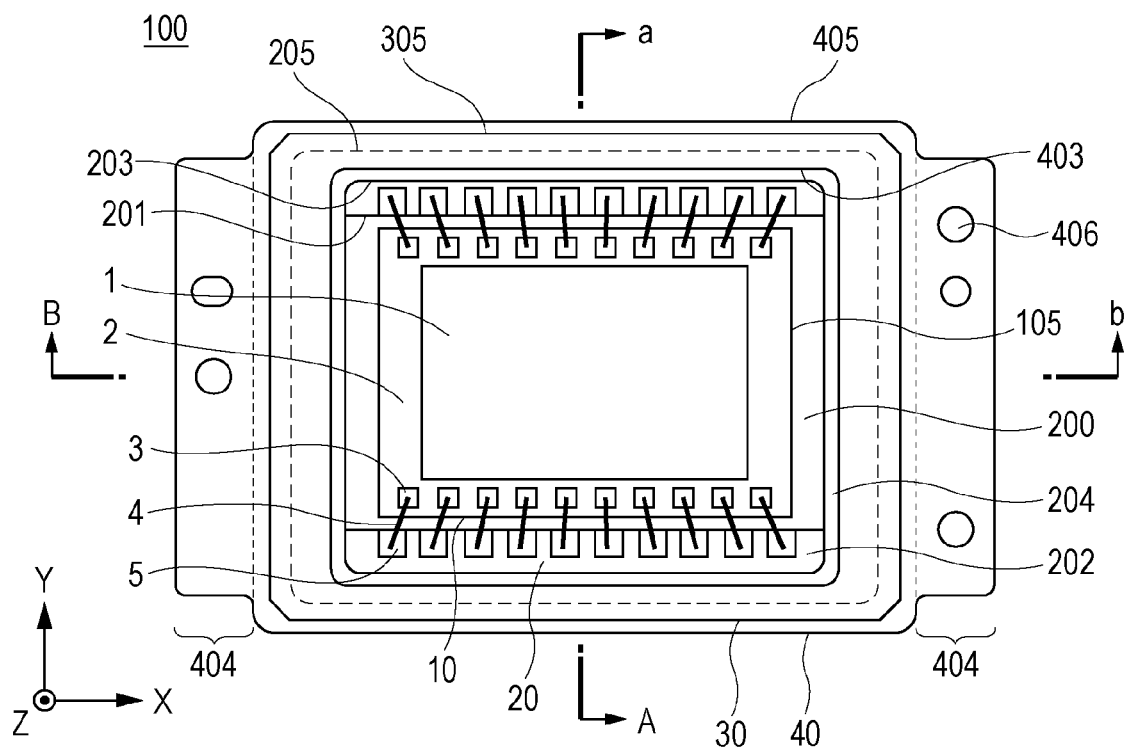
FIGS. 1A and 1B are schematic plan views of an example of an electronic component.
Figure 1B:
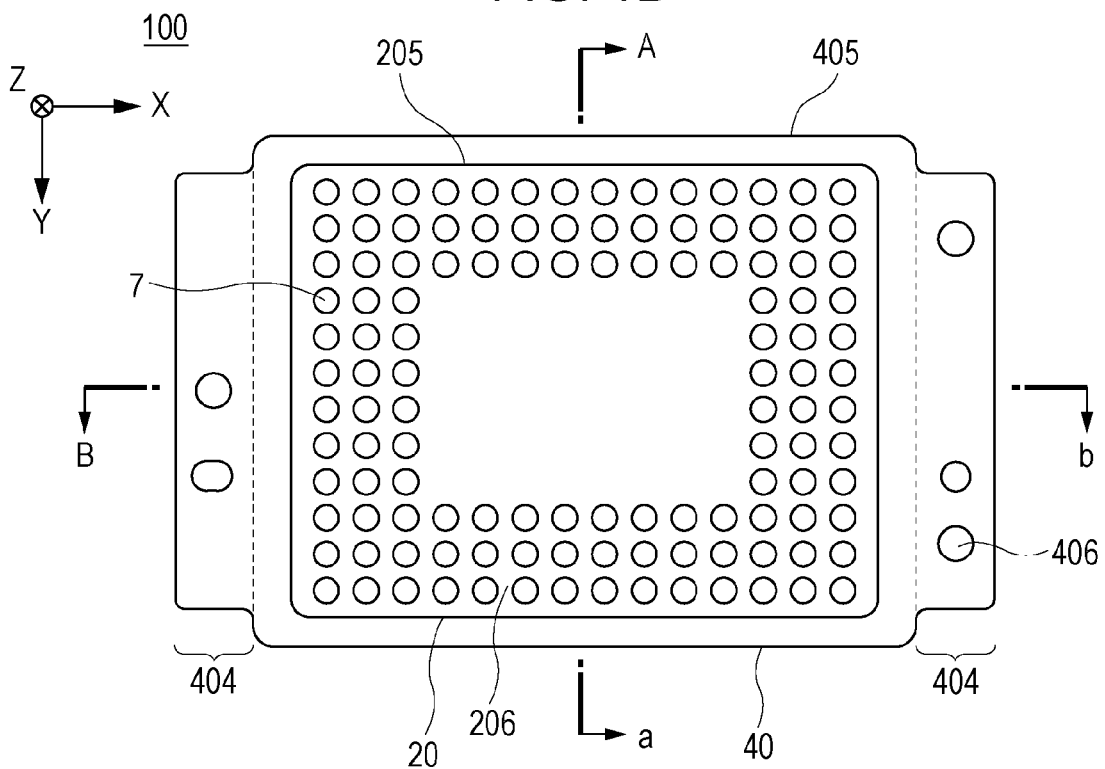
Figure 2A:
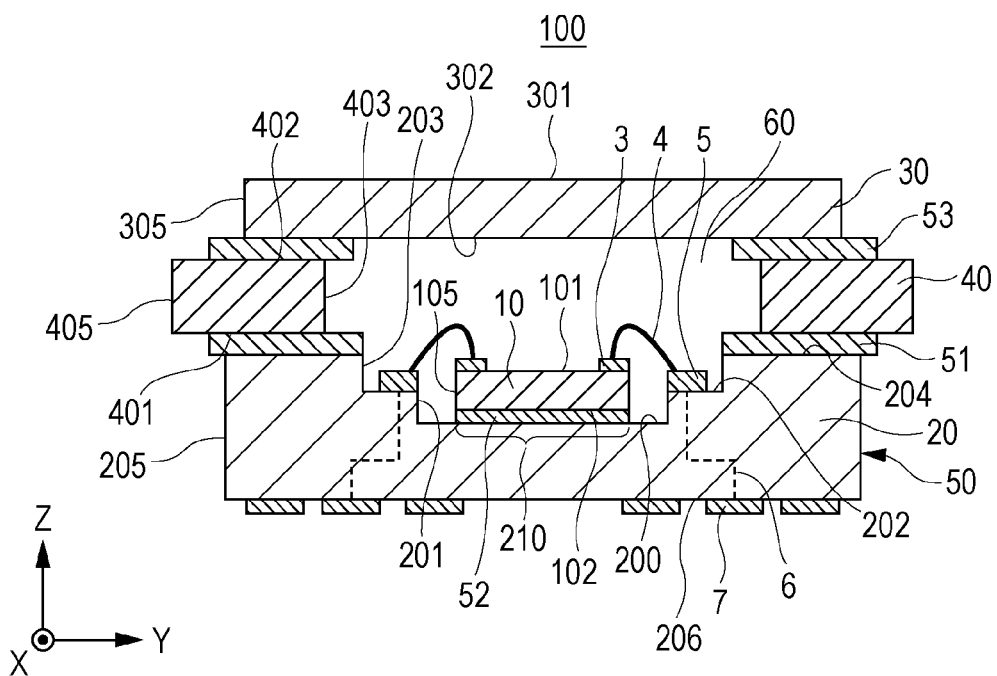
FIGS. 2A and 2B are schematic sectional views of the example of the electronic component.
Figure 2B:
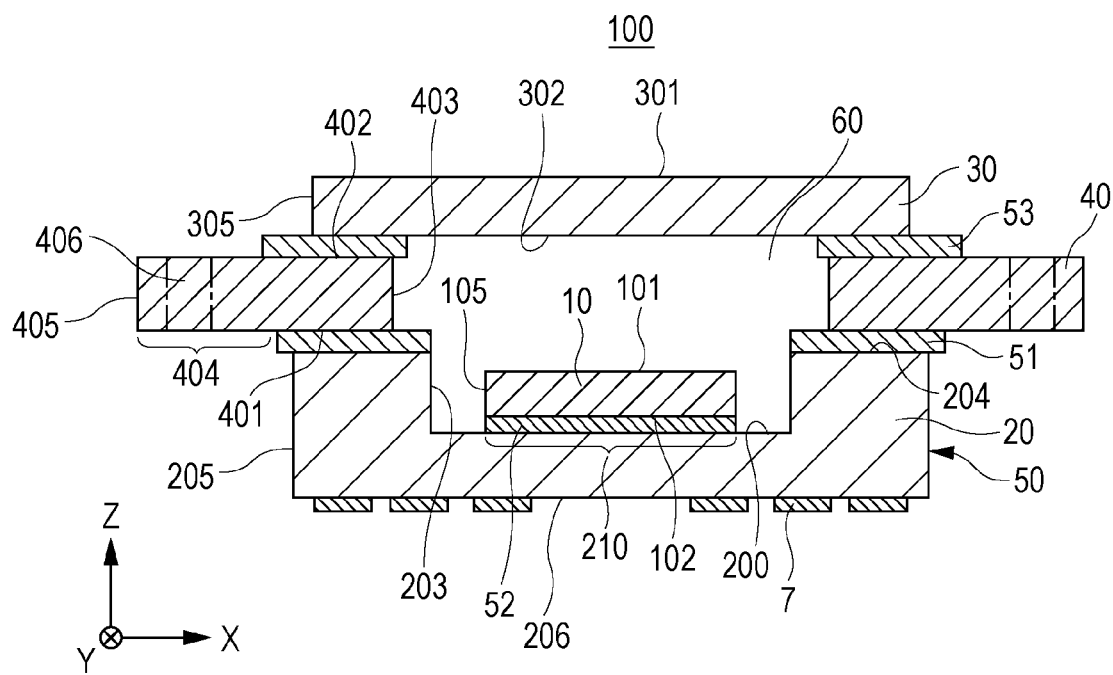
Figure 3A:
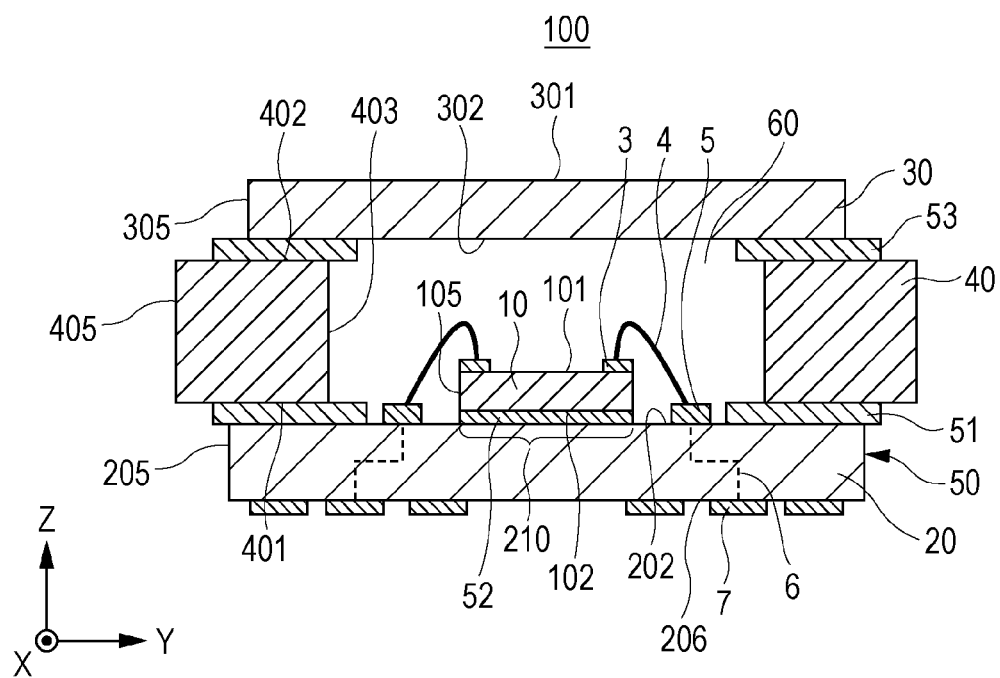
FIGS. 3A and 3B are schematic sectional views of an example of an electronic component.
Figure 3B:
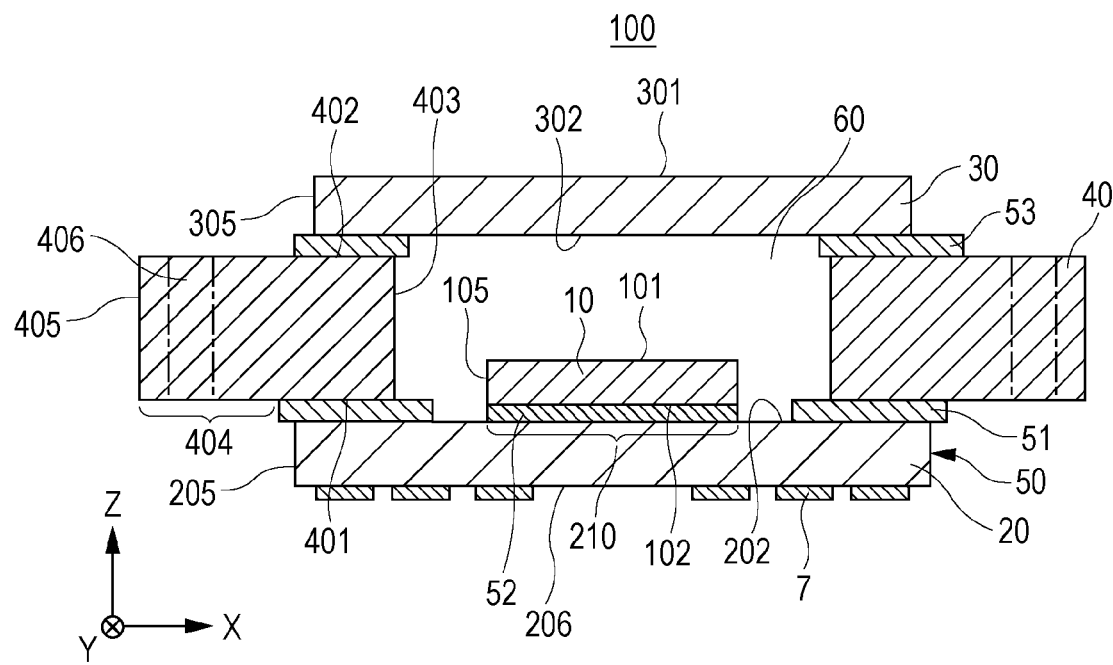

Examples of electronic components 100 are described as embodiments of the present invention. FIG. 1A is a schematic plan view when an electronic component 100 of a first example is viewed from the front. FIG. 1B is a schematic plan view when the electronic component 100 of the first example is viewed from the back. FIGS. 2A and 2B are schematic sectional views of the electronic component 100 of the first example. FIG. 2A is a sectional view of the electronic component 100 of the first example taken along line A-a in FIGS. 1A and 1B. FIG. 2B is a sectional view of the electronic component 100 of the first example taken along line B-b in FIGS. 1A and 1B. FIGS. 3A and 3B are sectional views of an electronic component 100 of a second example, which is a modification of the electronic component 100 of the first example, taken along lines similar to those of FIGS. 2A and 2B. The electronic component 100 of the first example is mainly described below with reference to the drawings while common reference signs are applied to the same or similar portions. The respective drawings indicate the X direction, Y direction, and Z direction.

The electronic component 100 includes an electronic device 10, and a package 50 that houses the electronic device 10. The package 50 mainly includes a base body 20, a lid body 30, and a frame body 40. Although the detail is described later, the base body 20 and the frame body 40 from among parts of the package 50 may function as a mounting member. The frame body 40 has an opening that corresponds to the electronic device 10. The lid body 30 may function as an optical member. The electronic device 10 is fixed to the base body 20. The lid body 30 is fixed to the base body 20 through the frame body 40. The lid body 30 faces the electronic device 10 through an inner space 60. The frame body 40 encloses the inner space 60 between the lid body 30 and the electronic device 10. The inner space 60 is formed in the opening of the frame body 40.

The positional relationship among members that form the electronic component 100 can be explained on the basis of a reference plane relating to the position of the electronic device 10. The reference plane is an imaginary plane that is located between a front surface 101 of the electronic device 10 and a back surface 102 of the electronic device 10 and penetrates through an outer edge 105 of the electronic device 10. The front surface 101 is located at one side of the reference plane (the side of the front surface), and the back surface 102 is located at the other side of the reference plane (the side of the back surface). The reference plane is a plane along the X-Y direction, and the Z direction is a direction perpendicular to the reference plane. If the electronic device 10 is a semiconductor device, the reference plane may be set at the interface between a semiconductor layer and an insulator layer for convenience of arrangement. The X direction and Y direction are typically parallel to a front surface 101 of the electronic device 10, a back surface 102 of the electronic device 10, an outer surface 301 of the lid body 30, and an inner surface 302 of the lid body 30. The electronic device 10 is bonded to the base body 20 such that the front surface 101 faces the inner surface 302 and the back surface 102 faces an arrangement region 210 of the base body 20. Also, the Z direction is perpendicular to the front surface 101, the back surface 102, the outer surface 301, and the inner surface 302. The electronic device 10 and the electronic component 100 typically have rectangular shapes in the X direction and Y direction. Also, the dimensions in the Z direction are smaller than the dimensions in the X direction and Y direction. Hence, the electronic device 10 and the electronic component 100 have substantially flat plate shapes. Hereinafter, a dimension in the Z direction is called thickness or height for convenience of description. Here, an orthogonal projection region is described. An orthogonal projection region of a certain member is a region in which the member can be projected in the Z direction perpendicular to the reference plane. A situation in which another member different from the certain member is located in the orthogonal projection region of the certain member represents that the certain member overlaps the other member in the Z direction. That is, if the other member is located within the orthogonal projection region of the certain member, it can be said that the other member is located in a region in which the other member overlaps the certain member in the Z direction. In contrast, if the other member is located outside the orthogonal projection region of the certain member, it can be said that at least part of the other member is located in a region in which the at least part of the other member does not overlap the certain member. The boundary between the inside and outside of an orthogonal projection region corresponds to the outer edge or inner edge (inner edge may not be present) that is the outline of a subject member. For example, the lid body 30 that faces the electronic device 10 is located in an orthogonal projection region of the electronic device 10, i.e., a region in which the lid body 30 overlaps the electronic device 10 in the Z direction.

In the X direction and Y direction, an outer edge of the electronic component 100 is determined by an outer edge 205 of the base body 20, an outer edge 405 of the frame body 40, and an outer edge 305 of the lid body 30. The frame body 40 has an inner edge 403 in addition to the outer edge 405. The opening of the frame body 40 is determined by the inner edge 403.

The type of the electronic device 10 is not particularly limited; however, is typically an optical device. The electronic device 10 of this example includes a main part 1 and a sub-part 2. The main part 1 is typically located at the center of the electronic device 10, and the sub-part 2 is typically located in the periphery of the main part 1. If the electronic device 10 is an image pickup device, such as a charge-coupled device (CCD) image sensor or a complementary metal-oxide semiconductor (CMOS) image sensor, the main part 1 is an image pickup unit. If the electronic device 10 is a display device, such as a liquid crystal display or an electroluminescence (EL) display, the main part 1 is a display unit. In the case of the image pickup device, the front surface 101 being a facing surface of the electronic device 10 facing the lid body 30 serves as a light incidence surface. This light incidence surface may be formed by a top layer of a multi-layer film provided on a semiconductor substrate having a light receiving surface. The multi-layer film includes layers having optical functions, such as a color filter layer, a microlens layer, an antireflection layer, and a light shielding layer; a layer having a mechanical function such as a planarizing layer; and a layer having a chemical function such as a passivation layer. The sub-part 2 has a driving circuit that drives the main part 1, and a signal processing circuit that processes a signal from the main part 1 (or a signal to the main part 1). If the electronic device 10 is a semiconductor device, such circuits are easily formed in a monolithic manner. The sub-part 2 has electrodes 3 (electrode pads) that allow the electronic device 10 to exchange signals with an external device.

At least part of a center region of the base body 20 is the arrangement region 210. The electronic device 10 is arranged on the arrangement region 210. The electronic device 10 is fixed to the base body 20. As shown in FIGS. 2A and 2B, the electronic device 10 is typically fixed through a jointing material 52 that is arranged between the arrangement region 210 of the base body 20 and the back surface 102 of the electronic device 10. Alternatively, the jointing material 52 may contact only an outer edge 105 that is a side surface of the electronic device 10 and the jointing material 52 may not be provided between the arrangement region 210 of the base body 20 and the back surface 102 of the electronic device 10. The jointing material 52 may be a conductive or insulating material. Also, the jointing material 52 desirably has high thermal conductance, and may contain metal particles.

The base body 20 includes an inner terminal 5 facing the inside (the inner space 60) of the package 50 and an outer terminal 7 facing the outside of the package 50. A plurality of the inner terminals 5 are arrayed and form an inner terminal group. In this example, as shown in FIG. 1A, an inner terminal group includes 10 inner terminals 5 arrayed in a line along the X direction, and two such lines (two groups) of the inner terminal groups are arranged in the Y direction. The arrangement of the inner terminals 5 is not limited to the above-described arrangement, and an inner terminal group may include inner terminals arrayed in a line along the Y direction, and two such lines of the inner terminal groups may be arranged in the X direction. Also, two lines of inner terminal groups each including inner terminals 5 arrayed in a line along the Y direction, and two lines of inner terminal groups each including inner terminals 5 arrayed in a line along the X direction may be arranged to enclose the electronic device 10. Also, a plurality of the outer terminals 7 form an outer terminal group. In this example, as shown in FIG. 1B, the outer terminal group including the outer terminals arrayed in rows and columns along the X direction and Y direction is arranged on a back surface 206 of the base body 20, the back surface 206 forming the back side of the electronic component 100. The arrangement of the outer terminals 7 is not limited to the above-described arrangement. Outer terminal groups may be arranged in lines in the X direction and/or Y direction along the outer edge 205 that is the side surface of the base body 20.

The inner terminals 5 and the outer terminals 7 are electrically continued through an embedded part 6 that is embedded as inner wiring in the base body 20. The electrodes 3 of the electronic device 10 and the inner terminals 5 of the package 50, which form the electronic component 100, are electrically connected through connection conductors 4. In this example, the electrodes 3 are connected with the inner terminals 5 by wire bonding connection, and the connection conductors 4 are metal wires (bonding wires). Alternatively, the electrodes 3 may be connected with the inner terminals 5 by flip-chip connection. In this case, the electrodes 3 are provided on the back surface 102 of the electronic device 10, and the inner terminals 5 and the connection conductors 4 are located in the arrangement region 210. In this example, the form of the outer terminals 7 is a land grid array (LGA). Alternatively, the form may be a pin grid array (PGA), a ball grid array (BGA), or a leadless chip carrier (LCC). With such a form, the plurality of outer terminals 7 may be located in an orthogonal projection region of the lid body 30 on the base body 20. Further, part of the plurality of outer terminals 7 may be located in an orthogonal projection region of the electronic device 10 on the base body 20. In this way, the plurality of outer terminals 7 may be arranged in a region where the outer terminals 7 overlap at least one of the electronic device 10, the base body 20 and the lid body 30 in the Z direction. The inner terminals 5, the embedded part 6, and the outer terminals 7 may be integrated by using a leadframe. In this case, the inner terminals 5 serve as an inner lead, and the outer terminals 7 serve as an outer lead. In a form of using the leadframe, the plurality of outer terminals 7 project from the outer edge 205 of the base body 20, and located out of an orthogonal projection region of the electronic device 10 or on the base body 20. The outer terminals 7 of the electronic component 100 are electrically connected with connection terminals of a wiring member of, for example, a printed wiring board, and at the same time are fixed to the wiring member. The outer terminals 7 may be electrically connected with an external circuit by reflow soldering with use of solder paste. In this way, the electronic component 100 is second-mounted on the wiring member and hence forms an electronic module. The electronic module may be also used as an electronic component. The mounting form is desirably surface mounting. By installing the electronic module in a housing, an electronic apparatus is formed.

The base body 20 has a concave shape, where the center region of the base body 20 is recessed with respect to a peripheral region that encloses the center region. More specifically, a plate-shaped part forms a bottom part of a concave shape, and a frame-shaped part provided on a peripheral region of the plate-shaped part forms a side part of the concave shape. The base body 20 may be formed by stacking a plate member and a frame member. Alternatively, the base body 20 may be integrally formed by, for example, die molding or cutting. The base body 20 may be a conductor such as a metal sheet as long as insulation of the inner terminals 5 and the outer terminals 7 is ensured. The base body 20, however, is typically formed of an insulator. Although the base body 20 may be a flexible substrate such as a polyimide substrate, the base body 20 is desirably a rigid substrate, such as a glass epoxy substrate, a composite substrate, a glass composite substrate, a Bakelite substrate, or a ceramic substrate. In particular, the ceramic substrate is desirable, and the base body 20 is desirably a laminated ceramic. The ceramic material may be silicon carbide, aluminum nitride, sapphire, alumina, silicon nitride, cermet, yttria, mullite, forsterite, cordierite, zirconia, or steatite.

As shown in FIGS. 2A, 2B, 3A, and 3B, the peripheral region of the base body 20 having the concave shape includes a stage part and a step part. The stage part is a part that extends in the X direction and Y direction. The step part is located between two stage parts at different heights in the Z direction, and extends in the Z direction.

The stage part provided with the inner terminals 5 is determined as a fiducial stage part 202. In this embodiment, as shown in FIGS. 2A and 3A, an upper stage part 204 is located at the side of the outer edge of the package 50 with respect to the inner terminal groups in the Y direction, that is, at the side of the outer edge 205 of the base body 20. The upper stage part 204 protrudes with respect to the fiducial stage part 202. That is, the upper stage part 204 is located at the side of the lid body 30 with respect to the fiducial stage part 202 in the Z direction. A step part 203 is located between the fiducial stage part 202 and the upper stage part 204. The step part 203 faces the connection conductors 4 through part of the inner space 60.

Also, in the example shown in FIGS. 2A and 2B, the base body 20 includes a lower stage part 200 in addition to the fiducial stage part 202 and the upper stage part 204. The lower stage part 200 is located at a position farther from the outer edge 205 of the base body 20 than the position of the inner terminal groups. That is, the lower stage part 200 is located at the inner side of the base body 20 than the positions of the inner terminal groups. The lower stage part 200 is recessed with respect to the fiducial stage part 202 through a step part 201. That is, the lower stage part 200 is located at a position farther from the lid body 30 than the positions of the inner terminal groups through the step part 201 in the Z direction. The step part 201 faces the outer edge 105 of the electronic device 10 through part of the inner space 60. The fiducial stage part 202 is located between the upper stage part 204 and the lower stage part 200. Hence, the fiducial stage part 202 may be called middle stage part. As shown in FIG. 2B, the fiducial stage part 202 is not provided between the lower stage part 200 and the upper stage part 204 in the X direction along which the inner terminals 5 are not provided. The step part 203 is located between the upper stage part 204 and the lower stage part 200. A middle stage part may be provided between the upper stage part 204 and the lower stage part 200 in the X direction like the middle stage part provided in the Y direction. However, such a middle stage part not provided with the inner terminals 5 may result in a needless increase in size of the package 50. Desirably, such a middle stage part is not provided.

In the modification shown in FIGS. 3A and 3B, the base body 20 has a flat plate shape without a stage part or a step part. Hence, in this example, a fiducial stage part in FIGS. 3A and 3B may be also called fiducial surface. The electronic device 10 and the frame body 40 are fixed to the surface of the fiducial stage part 202 on which the inner terminals 5 are arranged. The lower stage part 200 or the upper stage part 204 as shown in FIGS. 2A and 2B is not provided. Other points are similar to those of the electronic component 100 shown in FIGS. 2A and 2B.

The lid body 30 that faces the electronic device 10 has a function of protecting the electronic device 10. If the electronic device 10 is an image pickup device or a display device that uses light, the lid body 30 is required to be transparent to the light (typically, visible light). A suitable material for such a lid body 30 is, for example, plastic, glass, or quartz crystal. A surface of the lid body 30 may have antireflection coating or infrared cut coating.

Figure 4:
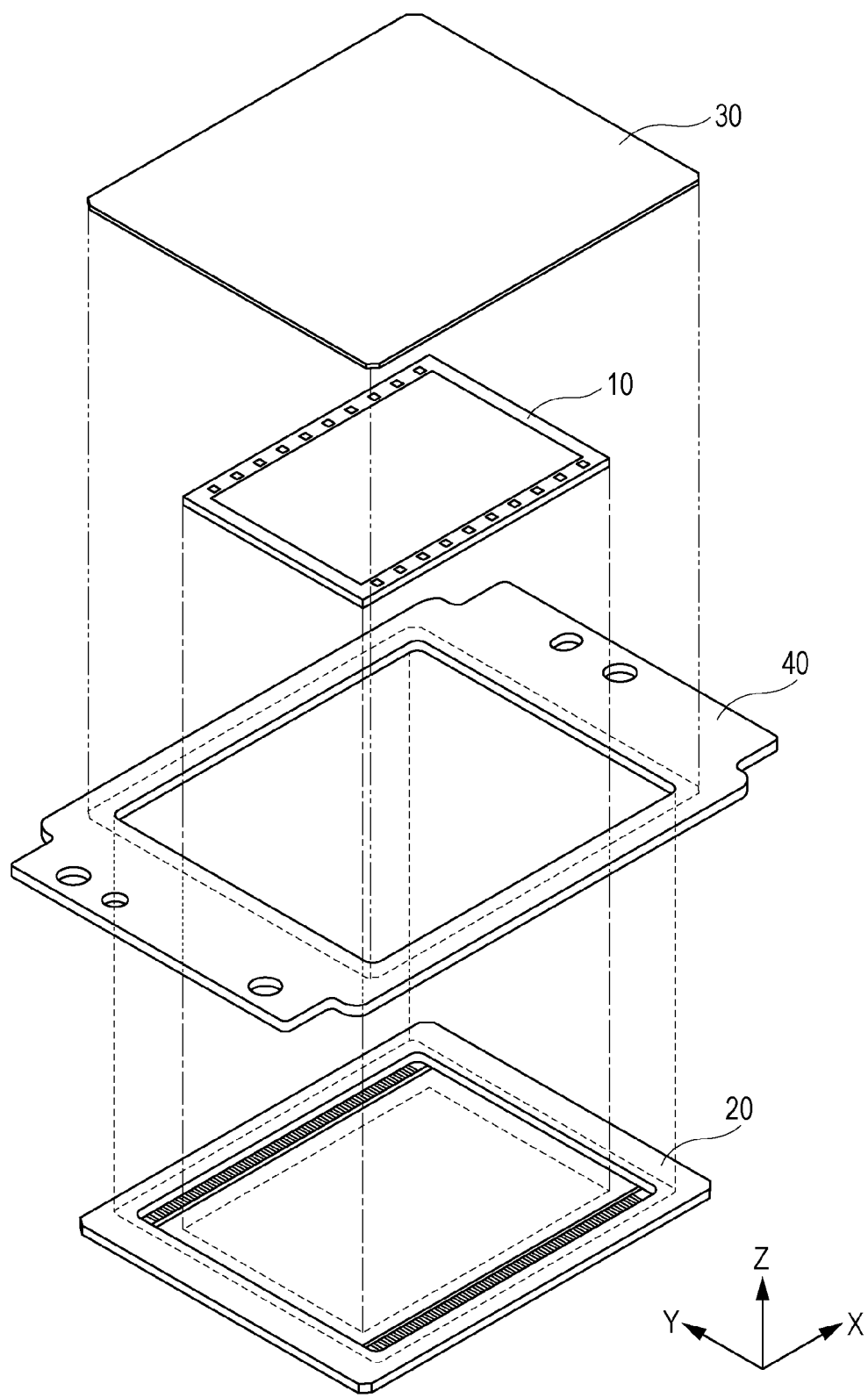
FIG. 4 is an exploded perspective view of the example of the electronic component.

FIG. 4 is an exploded view of the electronic component 100. As it is understood from FIG. 4, the electronic component 100 is formed by stacking the prepared electronic device 10, base body 20, lid body 30, and frame body 40 in the Z direction. In FIG. 4, long broken lines indicate the relationship between the base body 20 and the frame body 40, single-dot chain lines indicate the relationship between the electronic device 10 and the base body 20, and double-dot chain lines indicate the relationship between the frame body 40 and the lid body 30. Also, broken lines indicate the outline of the lid body 30 on the frame body 40, the outline of the electronic device 10 on the base body 20, and the outline of the frame body 40 on the base body 20.

The lid body 30 is fixed to the base body 20 through the frame body 40. More specifically, as shown in FIGS. 2A and 2B, the frame body 40 and the base body 20 are bonded to each other in the peripheral region enclosing the center region of the base body 20 through a jointing material 51. Also, as shown in FIGS. 2A and 2B, the frame body 40 and the lid body 30 are bonded to each other in a peripheral region enclosing a center region of the lid body 30 through a jointing material 53. The electronic device 10 and the inner space 60 are located between the center region of the base body 20 and the center region of the lid body 30. In this embodiment, the lid body 30 is located at the position farther from the electronic device 10 and the base body 20 than the position of the frame body 40 in the Z direction, and the jointing material 53 is provided on the inner surface 302 of the lid body 30, the inner surface 302 being a facing surface of the lid body 30 facing the electronic device 10. Alternatively, like a form in FIG. 3 of Japanese Patent Laid-Open No. 2003-101042, part of the frame body 40 may be located at a position farther from the electronic device 10 and the base body 20 than the position of the lid body 30 in the Z direction, and the jointing material 53 may be provided on the outer surface 301 of the lid body 30. The jointing materials 51, 52, and 53 have thicknesses in a range from 1 to 1000 μm, or typically in a range from 10 to 100 μm.

More specifically, the frame body 40 and the base body 20 are bonded with use of an adhesive, the electronic device 10 and the base body 20 are bonded with use of an adhesive, and the lid body 30 and the frame body 40 are bonded with use of an adhesive. The order of bonding these parts is not particularly limited. However, it is desirable that the frame body 40 and the base body 20 are bonded before the lid body 30 and the frame body 40 are bonded. Also, it is desirable that the frame body 40 and the base body 20 are bonded before the electronic device 10 and the base body 20 are bonded. That is, the frame body 40 and the base body 20 are bonded first, and hence the mounting member having an arrangement region for disposing an electronic device 10 thereon is formed. The electronic device 10 is fixed to the mounting member. Then, the lid body 30 is bonded to the mounting member on the arrangement region.

The base body 20 and the frame body 40 are bonded by the jointing material 51 desirably at the entire circumferences of their joint surfaces. Also, the lid body 30 and the frame body 40 are bonded by the jointing material 53 desirably at the entire circumferences of their joint surfaces. As described above, the entire circumferences of the peripheral regions of the base body 20 and the lid body 30 serve as bonding regions, so that the inner space 60 around the electronic device 10 becomes hermetically sealed from the outside air. Accordingly, a foreign substance is prevented from entering the inner space 60, and reliability is increased. To ensure hermeticity, the adhesive may be used by a sufficient amount.

The above-described jointing materials 51, 52, and 53 are formed by solidifying the applied adhesives. The type of adhesive may be, for example, drying solidification type through evaporation of a solvent, chemical reaction type by hardening through polymerization of molecules with light or heat, or thermal fusion (hot-melt) type by solidifying through setting of a molten adhesive. A typical adhesive may be a photo-curable resin that is hardened with an ultraviolet ray or visible light, or a thermosetting resin that is hardened with heat. The thermosetting resin is suitably used for the adhesives of the jointing material 51 and the jointing material 52. The photo-curable resin is suitably used for the adhesive of the jointing material 53. In the case of the thermosetting resin, the color of the adhesive and the jointing material is not particularly limited, and may be white, black, transparent, etc. In the case of the photo-curable resin, the color of the adhesive and the jointing material is transparent to visible light and/or ultraviolet light. The adhesive and the jointing material may properly contain an inorganic or organic filler. If the filler is contained, moisture resistance can be increased. Elastic modulus of the jointing material after the adhesive is hardened is not particularly limited. However, if the adhesive bonds different materials together, the adhesive is desirably relatively soft resin (resin with low elastic modulus). For example, the elastic modulus is desirably in a range from 1 MPa to 100 GPa, although it is not limited thereto.

The frame body 40 includes a joint surface 401 that faces the base body 20 and is bonded to the jointing material 51, and a joint surface 402 that faces the lid body 30 and is bonded to the jointing material 53. The frame body 40 is provided to enclose the inner space 60 between the electronic device 10 and the lid body 30. A surface of the frame body 40, the surface which faces the inner space 60 and encloses the inner space 60, is the inner edge 403. The frame body 40 in this example, in which the outer edge 405 of the frame body 40 is exposed to the outer space, has an extension part 404 that extends in the X direction from between the base body 20 and the lid body 30 to the outer space. The extension part 404 has a through hole 406. The through hole 406 is used for a screwing hole for fixture to a housing or the like of an electronic apparatus, or is used for a positioning hole. If the electronic device 10 is an image pickup device, the electronic apparatus includes an image pickup apparatus, such as a still camera or a video camera, and an information terminal having an image capturing function.

To enhance the hermeticity of the inner space 60, the frame body 40 desirably continuously encloses the inner space 60 without a break. Also, to ensure the rigidity of the frame body 40 and further the rigidity of the electronic component 100, the frame body 40 is desirably a closed loop without a break. Also, to ensure thermal conductance (described later), the frame body 40 is desirably a closed loop that is continuous in the circumferential direction. However, if limitation is provided in manufacturing, the frame body 40 may be divided into a plurality of sections on a side basis and may be arranged. Alternatively, the frame body 40 may have slits to allow the inner space 60 to communicate with the outer space. If the frame body 40 has breaks in this way, discontinuous portions (slits) generated in the frame body 40 are desirably as few as possible. More specifically, the total length of the discontinuous portions is desirably less than 10% of the length of the circumference that encloses the inner space 60 and the electronic device 10. In other words, if the frame body 40 is present by a length in total that is 90% or more of the length of the circumference along the circumference of the inner space 60 and the electronic device 10, it can be assumed that the frame body 40 encloses the inner space 60 and the electronic device 10.

The material of the frame body 40 may properly use resin, ceramic, or metal. The metal mentioned here includes not only a metal of one kind, but also an alloy of metals. In this embodiment, the frame body 40 and the base body 20 are bonded by using the adhesive. Hence, this embodiment is suitable when the material of the frame body 40 is different from the material of the base body 20. Also, this embodiment is suitable when the material of the frame body 40 is different from the material of the lid body 30. An example of such a case is when the material of the base body 20 is ceramic, the material of the lid body 30 is glass, and the material of the frame body 40 is metal or resin.

If the frame body 40 has a high thermal conductivity, heat of the electronic device 10 can be radiated through the extension part 404. For heat radiation, the thermal conductivity of the frame body 40 is preferably 1.0 W/m·K or higher, or more preferably 10 W/m·K or higher. A thermal conductivity of resin is typically lower than 1.0 W/m·K.

Also, to reduce a stress that is generated on the electronic component 100, the frame body 40 desirably has a thermal expansion coefficient (linear expansion coefficient) being as low as possible. More specifically, the thermal expansion coefficient of the frame body 40 is desirably 50 ppm/K or lower. A thermal expansion coefficient of resin is typically higher than 50 ppm/K.

In the viewpoint of the thermal conduction and thermal expansion, the material of the frame body 40 is desirably metal or ceramic. Ceramic can have a thermal property equivalent to that of metal; however, ceramic is a brittle material. Hence, in the viewpoint of processability and mechanical strength, metal is more suitable than ceramic. A typical metal material may be aluminum, an aluminum alloy, copper, a copper alloy, iron, an iron alloy, etc. These materials have high processability, and are relatively inexpensive. Also, if the electronic device 10 is an image pickup device, with regard to outdoor use, aluminum, an aluminum alloy, or an iron alloy having a high corrosion resistance is suitable. Further, the material of the frame body 40 is desirably an iron alloy, such as stainless steel, or other iron alloy containing chromium, nickel, or cobalt. For example, such a material may be SUS430 that is a ferritic stainless steel, SUS304 that is an austenitic stainless steel, 42 alloy, Kovar, etc.

The frame body 40 has a function of determining a gap between the electronic device 10 and the lid body 30, and a function of supporting the lid body 30. Also, the frame body 40 has a function as a heat radiating member since the frame body 40 has the above-described screwing hole or positioning hole and has a high thermal conductivity. Hence, the base body 20 and the frame body 40 may be collectively called mounting member.

An example of a manufacturing method relating to the electronic component 100 is described. FIGS. 5A to 7J are schematic sectional views taken along line A-a in FIGS. 1A and 1B.

Figure 5A:
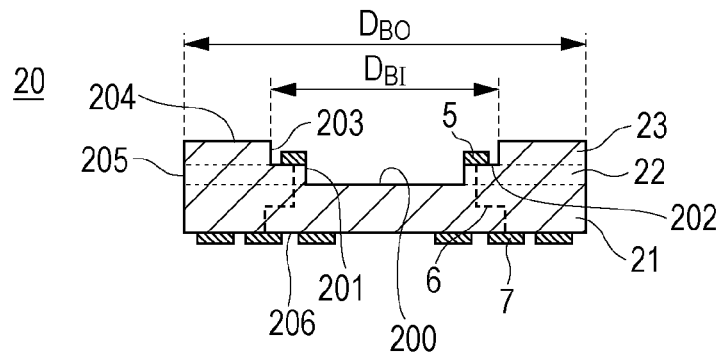
FIGS. 5A to 5C are schematic sectional views of an example of a manufacturing method of the electronic component (a mounting member).

FIG. 5A shows a step a of preparing the base body 20. As described above, the base body 20 equips the inner terminals 5, the embedded part 6, and the outer terminals 7. Also, the base body 20 has the step part 203 that connects the fiducial stage part 202 and the upper stage part 204, and also has the step part 201 that connects the fiducial stage part 202 and the lower stage part 200. The inner terminals 5 are provided on the fiducial stage part 202. The outer terminals 7 are provided on the back surface 206 of the base body 20.

Such a base body 20 is formed of a laminated ceramic that is formed, for example, as follows. First, a green sheet that is formed by a sheet forming method, such as a doctor blade method or a calender roller method, is punched with a plate die; a plurality of such punched green sheets are stacked; and hence a plate member of green ceramic is formed. Also, a green sheet, which is similarly formed, is punched with a frame die; a plurality of punched green sheets are stacked; and hence a frame member of green ceramic is formed. The plate member and the frame member are stacked and fired; and hence a laminated ceramic with a concave shape is fabricated. The laminated ceramic may be used as the base body 20. The inner terminals 5, the embedded part 6, and the outer terminals 7 may be formed by firing conductive paste patterns that are formed by a screen printing method etc. during the step of stacking the green sheets.

In this case, a first layer 21 that is a green ceramic plate member, a second layer 22 that is a green ceramic frame member with a small inner diameter, and a third layer 23 that is a green ceramic frame member with a large inner diameter before firing are shown. Since a frame die of the second layer 22 and a frame die of the third layer 23 have different inner diameters, the fiducial stage part 202 can be easily formed. If the base body 20 does not have the lower stage part 200 as shown in FIGS. 3A and 3B, the base body 20 may not be formed of the two kinds (the two layers) of the frame members but may be formed of one kind of the frame member in the example shown in FIGS. 3A and 3B. Accordingly, since the frame die for punching may be one kind, the cost can be decreased. An inner diameter $D_{BI}$ and an outer diameter $D_{BO}$ of the step part 203 of the base body 20 are properly determined in accordance with the size of the electronic device to be mounted.

Figure 5B:
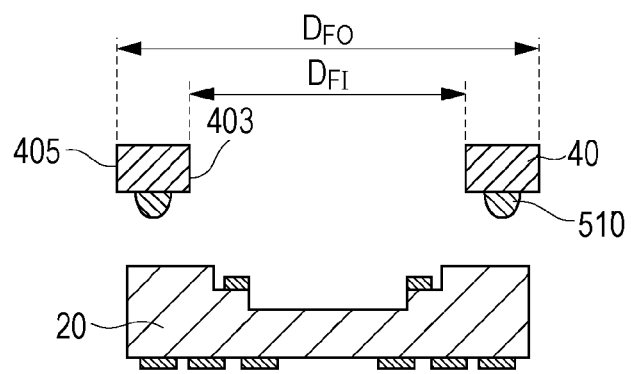

FIG. 5B shows a first phase b included in a step of bonding the base body 20 and the frame body 40. The formed frame body 40 is prepared. It is assumed that $D_{FI}$ is an inner diameter of the frame body 40, and $D_{FO}$ is an outer diameter of the frame body 40. Herein, the relationship between the sizes of the base body 20 and the frame body 40 is $D_{BI}<D_{FI}$. Also, $D_{BO}<D_{FO}$. The surfaces of the frame body 40 desirably have roughness by sandblasting. Then, as a second phase, an adhesive 510 is applied to at least one of the upper stage part 204 of the base body 20 and the joint surface 401 of the frame body 40. As shown in FIG. 5B, the adhesive 510 is desirably applied to only the joint surface 401 of the frame body 40. The frame body 40 is more flat than the base body 20, and hence the application amount of the adhesive 510 can be easily controlled. As described above, the adhesive 510 is typically thermosetting resin. The application of the adhesive 510 may use printing, dispensing, etc.

FIG. 5B shows an example frame body 40 that is completely flat. However, it is not limited thereto, and at least one of sides of the frame body 40 may have warping. Although described later in detail, since the frame body 40 to be bonded has warping, a mounting member 24 having the frame body 40 with high flatness can be obtained.

Then, as a third phase, the frame body 40 is mounted on the upper stage part 204 of the base body 20. The lower stage part 200 being the center region of the base body 20 containing the arrangement region of the electronic device corresponds to the opening of the frame body 40, and the upper stage part 204 being the peripheral region of the base body 20 corresponds to the frame body 40. Herein, the step part 203 of the base body 20 is located at the side of the inner terminals 5 with respect to the inner edge 403 of the frame body 40. An offset amount $D_{OS}$ between the step part 203 and the inner edge 403 at this time depends on the difference between the inner diameter $D_{FI}$ and the inner diameter $D_{BI}$. Typically, $D_{OS}=(D_{FI}-D_{BI})/2$ is established. Accordingly, the frame body 40 and the base body 20 are superposed in the state in which the adhesive 510 is interposed between the frame body 40 and the base body 20. In contrast, a region (offset region) that has a width corresponding to the offset amount $D_{OS}$ and that is not superposed on the frame body 40 is formed on the upper stage part 204.

Of course, the adhesive 510 is liquid at this time. When the frame body 40 is pressed to the base body 20 due to the self-weight of the frame body 40 or a pressure, an excess of the adhesive 510 may protrude from between the frame body 40 and the base body 20. However, the protruding adhesive 510 is held on the offset region, and hence the adhesive 510 can be prevented from adhering to the inner terminals 5 etc.

Figure 5C:
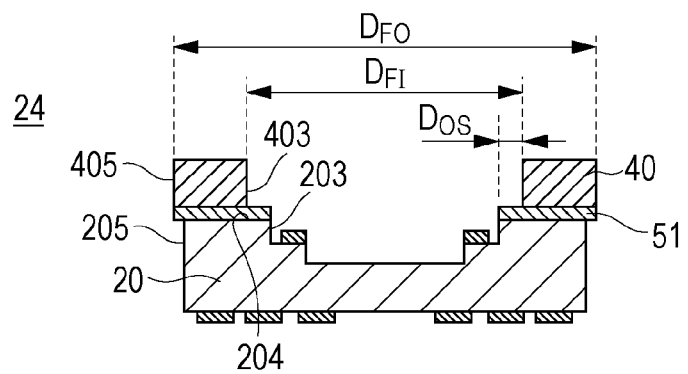

FIG. 5C shows a fourth phase c included in the step of bonding the base body 20 and the frame body 40. The applied adhesive 510 is solidified by a proper method. The suitable adhesive 510 is thermosetting resin, and is hardened with heat (thermosetting) at temperatures in a range from about 80° C. to 200° C. Accordingly, the liquid adhesive 510 becomes the solid jointing material 51, and the frame body 40 and the base body 20 are bonded through the jointing material 51. In a fifth phase, the frame body 40 and the base body 20 are cooled to a predetermined temperature (for example, room temperature) after the thermosetting. The cooling method is not particularly limited, and may be natural cooling or forced cooling by air cooling etc. In this way, the mounting member 24 including the frame body 40 and the base body 20, and having the arrangement region on which an electronic device is to be arranged, can be manufactured. The mounting member 24 equips the inner terminal 5 that is to be electrically connected with an electronic device and the outer terminal 7 that is to be fixed to a wiring member.

Figure 6D:
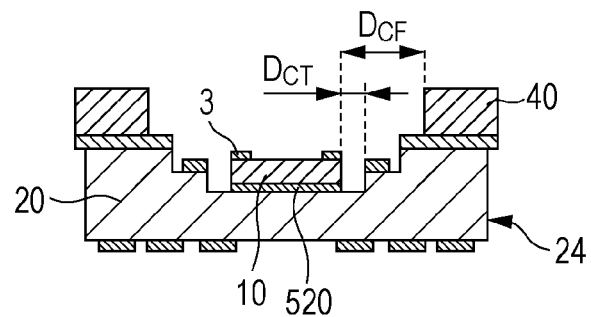
FIGS. 6D to 6G are schematic sectional views of the example of the manufacturing method of the electronic component.

FIG. 6D shows a step d of fixing the electronic device 10 to the base body 20. The electronic device 10 has the electrodes 3. An adhesive 520 such as die bond paste is applied to at least one of the lower stage part 200 of the base body 20 and the back surface 102 of the electronic device 10 (typically, only the lower stage part 200 of the base body 20). Then, the electronic device 10 is arranged on the adhesive 520. Then, as shown in FIG. 6E, the adhesive 520 is solidified, the jointing material 52 is formed, and hence the electronic device 10 and the base body 20 are bonded.

Figure 6E:
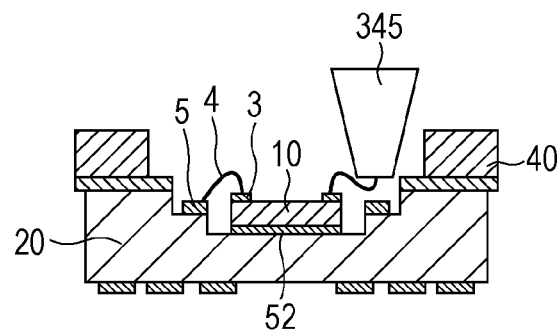

FIG. 6E shows a step e of electrically connecting the electronic device 10 with the base body 20. In this example, wire bonding connection is used. One end of a metal wire fed from a distal end of a capillary 345 is connected with the corresponding electrode 3, and then the other end of the metal wire is connected with the corresponding inner terminal 5. The metal wire forms the connection conductor 4. If flip-chip connection is employed, a bump may serve as the jointing material 52 and the connection conductor 4. Herein, the base body 20 has the configuration in which the electronic device 10 is provided on the lower stage part 200, and the fiducial stage part 202 provided with the inner terminals 5 is located above the lower stage part 200. Owing to this, an area in which the capillary 345 may interfere with the step part 203, the upper stage part 204, and the electronic device 10 can be decreased. Thus, the electronic component 100 can be decreased in size.

Figure 6F:
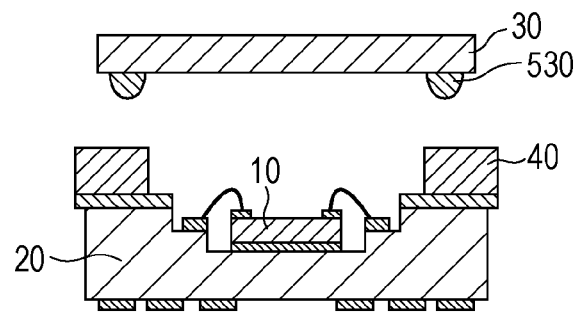

FIG. 6F shows a former phase f included in a step of bonding the lid body 30 to the frame body 40. FIG. 6F shows a state after all the inner terminals 5 and all the electrodes 3 are connected through the connection conductors 4. An adhesive 530 is applied to at least one of the joint surface 402 of the frame body 40 and the joint surface (in this example, the inner surface 302) of the lid body 30. As described above, the adhesive 530 is typically photo-curable resin. The application of the adhesive 530 may use printing, dispensing, etc. As shown in FIG. 6F, the adhesive 530 is desirably applied to only the inner surface 302 of the lid body 30. When dispensing is employed, if an application surface of a subject to which an adhesive is applied has undulations, the application amount of the adhesive may vary. The lid body 30 is more flat than the frame body 40, and hence the application amount of the adhesive 530 can be easily controlled.

Figure 6G:
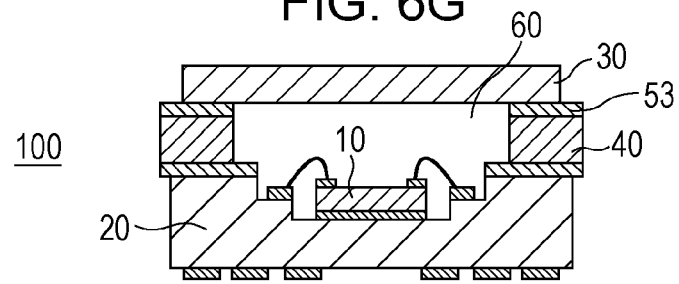

FIG. 6G shows a latter phase g included in the step of bonding the lid body 30 to the frame body 40. The lid body 30 is mounted on the frame body 40. Of course, the adhesive 530 is liquid at this time. When the lid body 30 is pressed to the frame body 40 due to the self-weight of the lid body 30 or a pressure, an excess of the adhesive 530 may protrude from between the frame body 40 and the lid body 30.

Then, the applied adhesive 530 is solidified by a proper method. Accordingly, the liquid adhesive 530 becomes the solid jointing material 53, and the frame body 40 and the lid body 30 are bonded through the jointing material 53. Photocurable resin is used as the adhesive 530 by the following reason. When the adhesive 530 is applied to the entire circumference of the joint surface, if a thermosetting adhesive is used as the adhesive 530, the inner space 60 may be expanded with heat when being heated, and the liquid adhesive 530 may be pushed out due to the internal pressure. If a photo-curable adhesive is used, such a phenomenon does not occur. If the photo-curable adhesive is semi-hardened by photo-curing, auxiliary thermosetting may be used for post-hardening. To properly use the photo-curable adhesive 510, the lid body 30 desirably has sufficient light transmissivity for wavelengths with which the adhesive 510 reacts, such as an ultraviolet ray. In this way, the electronic component 100 can be manufactured.

Figure 7H:
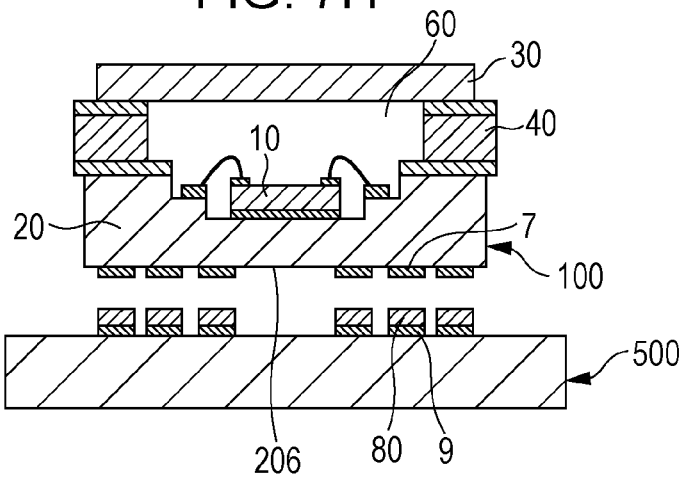
FIGS. 7H to 7J are schematic sectional views of an example of a manufacturing method of an electronic apparatus.

FIG. 7H shows a former phase h of a manufacturing method of an electronic module 600. A wiring member 500 for second-mounting the electronic component 100 fabricated as described above is prepared. The wiring member is, for example, a rigid wiring board, a flexible wiring board, or a rigid-flexible wiring board, and is typically a printed wiring board. Solder paste 80 (solder cream) is applied to connection terminals 9 of the wiring member 500 by a known method such as screen printing. Then, the electronic component 100 is mounted on the wiring member 500 such that the back surface 206 of the base body 20 faces the wiring member 500, and the solder paste 80 is interposed between the connection terminals 9 and the outer terminals 7.

Figure 7I:
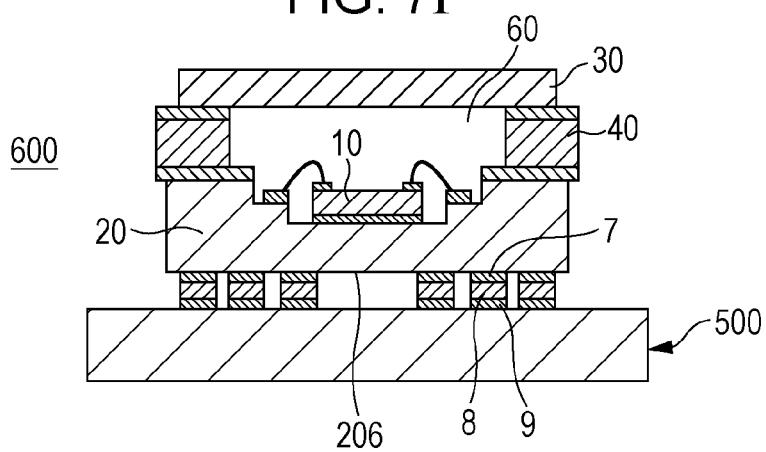

FIG. 7I shows a latter phase i of the manufacturing method of the electronic module 600. The electronic component 100 and the wiring member 500 are put into a furnace (reflow oven), the solder paste 80 is molten at temperatures in a range from about 180° C. to 250° C., and solder serving as connection conductors 8 is formed. In this way, the electronic component 100 is fixed to the wiring member 500 by reflow soldering. Thus, the electronic module 600 including the electronic component 100 and the wiring member 500 can be manufactured. It is to be noted that an electronic component other than the electronic component 100, for example, an integrated circuit component, a discrete component, etc., may be mounted on the wiring member 500.

Figure 7J:
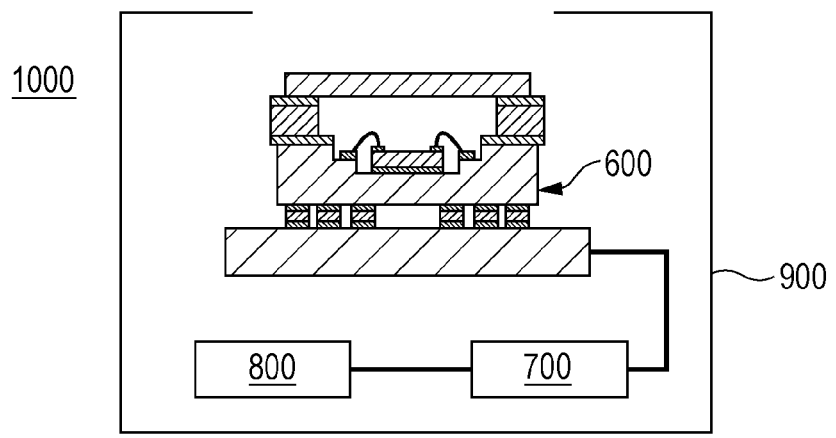

FIG. 7J shows an electronic apparatus 1000. The wiring member 500 of the electronic module 600 is connected with an external circuit 700. The external circuit is, for example, a processor or a memory. The external circuit may be an integrated circuit component. Other electronic component 800 such as a display is connected with the external circuit. These components and circuits are housed in a housing 900, and thus the electronic apparatus 1000 can be manufactured. The extension part 404 for heat radiation provided at the electronic component 100 is thermally connected with the housing 900 or a heat sink that is provided in the housing 900. Accordingly, heat generated at the electronic device 10 is radiated to the outside through the extension part 404.

As described above, the mounting member 24, the electronic component 100, the electronic module 600, and the electronic apparatus 1000 can be manufactured.

Described below are a thermal expansion coefficient $\alpha_D$ of the electronic device 10, a thermal expansion coefficient $\alpha_B$ of the base body 20, a thermal expansion coefficient $\alpha_F$ of the frame body 40, a thermal expansion coefficient $\alpha_L$ of the lid body 30, and a thermal expansion coefficient $\alpha_C$ of the wiring member 500 according to this embodiment.

During use of the electronic component 100, to restrict deformation caused by thermal expansion when the electronic device 10 generates heat, main configuration members of the package 50 are set to have lower thermal expansion coefficients than the thermal expansion coefficient $\alpha_C$ of the wiring member 500. This is because the electronic device 10 is a heat generation source, and the configuration members of the package 50 being materials at relatively close distances to the electronic device 10 are likely increased in temperature. More specifically, the thermal expansion coefficient $\alpha_B$ of the base body 20, the thermal expansion coefficient $\alpha_F$ of the frame body 40, and the thermal expansion coefficient $\alpha_L$ of the lid body 30 are lower than the thermal expansion coefficient $\alpha_C$ of the wiring member 500 ($\alpha_B$, $\alpha_F$, $\alpha_L < \alpha_C$). The thermal expansion coefficient $\alpha_C$ of the wiring member 500 is preferably 50 ppm/K or lower, or more preferably 25 ppm/K or lower. The typical thermal expansion coefficient $\alpha_C$ of the wiring member 500 is in a range from 15 to 20 ppm/K. Also, the typical thermal expansion coefficient $\alpha_p$ of the electronic device 10 is lower than thermal expansion coefficients of the main configuration members of the package 50. More specifically, the thermal expansion coefficient $\alpha_B$ of the base body 20, the thermal expansion coefficient $\alpha_F$ of the frame body 40, and the thermal expansion coefficient $\alpha_L$ of the lid body 30 are higher than the thermal expansion coefficient $\alpha_p$ of the electronic device 10 ($\alpha_B$, $\alpha_F$, $\alpha_L > \alpha_D$). Hence, typically, $\alpha_C > \alpha_D$ is established.

In this embodiment, in the phase b to the phase c, the base body 20 being substantially flat and the frame body 40 being substantially flat are bonded by the adhesive 510 that is thermosetting resin. At this time, the base body 20 and the frame body 40 can be relatively freely expanded/contracted before the bonding. However, the base body 20 and the frame body 40 cannot be relatively freely expanded/contracted after the bonding. Owing to this, a change in stress between the base body 20 and the frame body 40 becomes irreversible between a low temperature (room temperature) state before the thermosetting and a low temperature (room temperature) state after the thermosetting. Hence, after the flat base body 20 and the flat frame body 40 are bonded by the adhesive 510 that is the thermosetting resin as shown in FIGS. 8A and 9A, a difference is generated between contraction amounts of the base body 20 and the frame body 40 in the cooling process from a high temperature (curing temperature) state to the low temperature state. The difference in contraction amount causes the base body 20 to warp as shown in FIGS. 8B and 9B. This warping is generated such that a member with a large contraction amount pulls a peripheral region of a member with a small contraction amount toward a center region of the member with the small contraction amount. In this case, the example using the thermosetting adhesive is provided. However, the adhesive is not limited to thermosetting adhesive, as long as a method of bonding the base body 20 and the frame body 40 while heating the base body 20 and the frame body 40 is employed, that is, as long as a bonding method of fixing both bodies in a state at a higher temperature than the room temperature is employed. If $\alpha_F > \alpha_B$, as shown in FIG. 8B, the base body 20 protrudes toward the side opposite to the frame body 40 (lower side). This shape is called a lower warp shape. If $\alpha_F < \alpha_B$, as shown in FIG. 9B, the base body 20 protrudes toward the side of the frame body 40 (upper side). This shape is called an upper warp shape. As described above, the warping direction of the base body 20 is changed in accordance with the relationship between the degrees of $\alpha_F$ and $\alpha_B$. The phase c and later steps are desirably performed so that the warping of the base body 20 is not increased and the base body 20 finally approaches a flat state. The difference (absolute value) between $\alpha_F$ and $\alpha_B$ is desirably 10.2 ppm/K or lower. The warping degree of the base body 20 is more decreased if $\alpha_F > \alpha_B$ because the frame body 40 does not have a center region. Hence, $\alpha_F > \alpha_B$ is desirably satisfied.

First, a case when $\alpha_F > \alpha_B$ is described below. As shown in FIG. 8C, the electronic device 10 that is fixed to the center region (the arrangement region 210) of the base body 20 with a lower warp shape of the mounting member 24 likely warps in a lower warp shape along the lower warp shape of the arrangement region 210 of the base body 20. A load may be applied to the electronic device 10 so that the electronic device 10 warps along the shape of the base body 20. This is for flattening the electronic device 10 when the base body 20 becomes flat as described later. When the adhesive 520 is thermosetting resin, the base body 20 and the electronic device 10 are expanded with heat when the adhesive 520 is hardened by thermosetting. If the thermal expansion coefficient $\alpha_D$ of the electronic device 10 is higher than the thermal expansion coefficient $\alpha_B$ of the base body 20 ($\alpha_B < \alpha_D$), the contraction amount of the electronic device 10 during the cooling after the thermosetting is larger than the contraction amount of the base body 20, and the warping with the lower warp shape of the base body 20 may become large. Hence, the thermal expansion coefficient $\alpha_D$ of the electronic device 10 is desirably lower than the thermal expansion coefficient $\alpha_B$ of the base body 20 ($\alpha_B > \alpha_D$).

The flat lid body 30 may be held flat after the flat lid body 30 is bonded by the adhesive 530 that is photo-curable resin as shown in FIG. 8D. However, if the lid body 30 and the frame body 40 are bonded while being heated, both the lid body 30 and the base body 20 are fixed in a state in which the lid body 30 and the base body 20 are expanded with heat during the thermosetting. This is a case, for example, when both photo-curing and thermosetting are used for solidifying the adhesive 530, or when only thermosetting is performed. In this case, if the thermal expansion coefficient $\alpha_L$ of the lid body 30 is higher than the thermal expansion coefficient $\alpha_F$ of the frame body 40 ($\alpha_L > \alpha_F$), the lid body 30 pulls the frame body 40 inward after contraction of the lid body 30. Hence, the warping with the lower warp shape of the base body 20 is increased. As the result, coplanarity of the base body 20 tends to be degraded, and in particular, the yield of reflow soldering for the outer terminals 7 located in the peripheral region tends to be decreased. To increase the yield for the reflow soldering, the thermal expansion coefficient $\alpha_L$ of the lid body 30 is desirably lower than the thermal expansion coefficient $\alpha_F$ of the frame body 40 ($\alpha_L < \alpha_F$). Alternatively, $\alpha_L$ and $\alpha_F$ may be equivalent. Further, the thermal expansion coefficient $\alpha_L$ of the lid body 30 is desirably lower than the thermal expansion coefficient $\alpha_B$ of the base body 20 ($\alpha_L < \alpha_B$). Alternatively, $\alpha_L$ and $\alpha_B$ may be equivalent.

As shown in FIGS. 8E and 8F, the base body 20 of the electronic component 100 before the reflow soldering has the lower warp shape, whereas the wiring member 500 before the reflow soldering is flat. Regarding the base body 20 and the wiring member 500 heated in a reflow oven, in a process from when solder bonding is completed to when the temperature returns to the room temperature, the wiring member 500 has a larger contraction amount than that of the base body 20. This is because the thermal expansion coefficient $\alpha_C$ of the wiring member 500 is higher than the thermal expansion coefficient $\alpha_B$ of the base body 20 ($\alpha_C > \alpha_B$). As the result, a stress that the wiring member 500 corrects the warping of the base body 20 acts between the base body 20 and the wiring member 500.

The warping of the base body 20 is decreased at the room temperature, and the entire electronic module 600 becomes flat. The wiring member 500 can have a sufficient correction force if the wiring member 500 is a rigid substrate rather than a flexible substrate.

A stress that the base body 20 warps in a lower warp shape acts from the frame body 40 to the base body 20. However, the thermal expansion coefficient $\alpha_C$ of the wiring member 500 is higher than the thermal expansion coefficient $\alpha_B$ of the base body 20, the thermal expansion coefficient $\alpha_F$ of the frame body 40, and the thermal expansion coefficient $\alpha_L$ of the lid body 30 ($\alpha_B, \alpha_F, \alpha_L < \alpha_C$). Hence, the contraction with heat of the wiring member 500 is larger than the contraction with heat of the frame body 40 and the lid body 30.

Regarding the above description, by satisfying any of the following relationships (i), (ii), and (iii) and hence by finally flattening the base body 20, the flatness of the electronic device 10 is increased, and good performance of the electronic component 100 can be obtained. From among these relationships, in order to increase the yield of the reflow soldering, the relationships (i) and (ii) satisfying $\alpha_L \leq \alpha_F$ are desirable, and the relationship (i) satisfying $\alpha_L < \alpha_B$ is more desirable. The relationships (i), (ii), and (iii) are as follows:

$$\alpha_L \leq \alpha_B < \alpha_F < \alpha_C, \quad (i)$$

$$\alpha_B < \alpha_L \leq \alpha_F < \alpha_C, \quad (ii)$$

and $$\alpha_B < \alpha_F < \alpha_L < \alpha_C \quad (iii).$$

Next, a case when $\alpha_F < \alpha_B$ is described below.

As shown in FIG. 9C, the electronic device 10 that is fixed to the center region (the arrangement region 210) of the base body 20 of the mounting member 24 with an upper warp shape likely warps in an upper warp shape along the upper warp shape of the arrangement region 210 of the base body 20. A load may be desirably applied to the electronic device 10 so that the electronic device 10 warps along the shape of the base body 20. When the adhesive 520 is thermosetting resin, the base body 20 and the electronic device 10 are thermally expanded when the adhesive 520 is hardened by thermosetting. If the thermal expansion coefficient $\alpha_D$ of the electronic device 10 is lower than the thermal expansion coefficient $\alpha_B$ of the base body 20 ($\alpha_B > \alpha_D$), the contraction amount of the base body 20 during the cooling after the thermosetting is larger than the contraction amount of the electronic device 10, and the warping with the upper warp shape of the base body 20 may become large. Hence, a condition for properly manufacturing an electronic component becomes more strict than the case of $\alpha_F > \alpha_B$.

As shown in FIG. 9E, if the lid body 30 and the frame body 40 are bonded while being heated, both the lid body 30 and the base body 20 are fixed in a state in which the lid body 30 and the base body 20 are thermally expanded during the thermosetting. This is a case, for example, when both photo-curing and thermosetting are used for solidifying the adhesive 520, or when only thermosetting is performed. In this case, the thermal expansion coefficient $\alpha_L$ of the lid body 30 is determined to be higher than the thermal expansion coefficient $\alpha_F$ of the frame body 40 ($\alpha_L > \alpha_F$). Accordingly, as shown in FIG. 9D, the warping with the upper warp shape of the base body 20 of the mounting member 24 along the upper warp shape is reduced by the contraction of the lid body 30. FIG. 9E shows the entirely flattened electronic component 100; however, the electronic component 100 may have a reduced upper warp shape. Further, the thermal expansion coefficient $\alpha_L$ of the lid body 30 is desirably higher than the thermal expansion coefficient $\alpha_B$ of the base body 20 ($\alpha_L > \alpha_B$). Alternatively, $\alpha_L$ and $\alpha_B$ may be equivalent. If the thermal expansion coefficient $\alpha_L$ of the lid body 30 is lower than the thermal expansion coefficient $\alpha_B$ of the base body 20, the effect of reducing the warping with the upper warp shape by the lid body 30 is decreased. In some cases, the warping with the upper warp shape may be increased.

As shown in FIG. 9F, the electronic component 100 before the reflow soldering has a flat or a reduced upper warp shape, whereas the wiring member 500 before the reflow soldering is flat. Hence, coplanarity of the plurality of outer terminals 7 of the electronic component 100 is good, and the yield of the reflow soldering is increased. However, the thermal expansion coefficient $\alpha_C$ of the wiring member 500 is higher than the thermal expansion coefficient $\alpha_B$ of the base body 20 ($\alpha_C > \alpha_B$). Hence, regarding the base body 20 and the wiring member 500 heated in a reflow oven, in a process from when solder bonding is completed to when the temperature returns to the room temperature, the wiring member 500 has a larger contraction amount than that of the base body 20. As the result, a stress that the wiring member 500 increases the warping of the base body 20 acts between the base body 20 and the wiring member 500. The warping with the upper warp shape of the base body 20 is increased or a flat configuration warps in an upper warp shape at the room temperature. Hence, if $\alpha_F < \alpha_B$, the flatness of the electronic device 10 is decreased as compared with the case of $\alpha_F > \alpha_B$. Hence, in the case of an image pickup device, if the flatness of the electronic device 10 significantly relates to the performance, a flatness defect of the electronic device 10 is desirably compensated by a factor other than the electronic component 100. This compensation may be, for example, focus adjustment of an optical system or image correction by software.

As described above, by satisfying any of the following relationships (iv) and (v) and hence by flattening the base body 20 during the reflow soldering, the yield of the reflow soldering can be increased. The relationships (iv) and (v) are as follows:

$$\alpha_F < \alpha_B < \alpha_L < \alpha_C, \quad \text{(iv)}$$

and $$\alpha_F < \alpha_L \leq \alpha_B < \alpha_C \quad \text{(v)}.$$

With the above-described relationships (i) and (ii), both the thermal expansion coefficients $\alpha_B$ and $\alpha_L$ of the base body 20 and the lid body 30 located at both sides of the frame body 40 are lower than the thermal expansion coefficient $\alpha_F$ of the frame body 40. In contrast, with the above-described relationships (iv) and (v), both the thermal expansion coefficients $\alpha_B$ and $\alpha_L$ of the base body 20 and the lid body 30 located at both sides of the frame body 40 are higher than the thermal expansion coefficient $\alpha_F$ of the frame body 40. As described above, since the thermal expansion coefficient $\alpha_F$ of the frame body 40 is not between the thermal expansion coefficient $\alpha_B$ of the base body 20 and the thermal expansion coefficient $\alpha_L$ of the lid body 30, asymmetry of warping generated at the electronic component 100 can be reduced. As the result, the yield of the reflow soldering is increased.

Figure 10A:
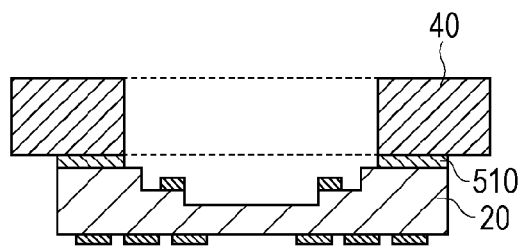
FIGS. 10A to 10D are schematic sectional views explaining warping.
Figure 10B:
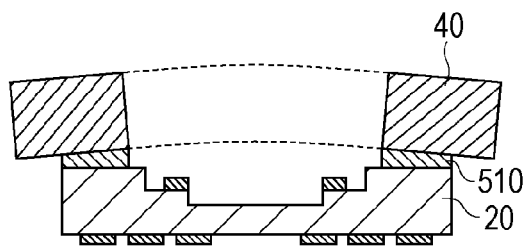
Figure 10B:
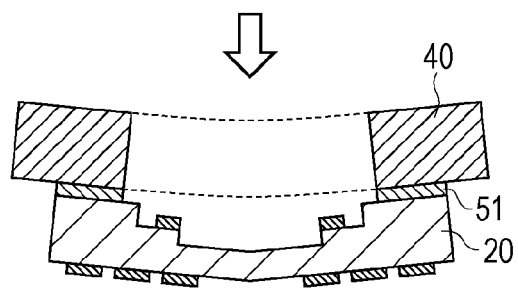
Figure 10B:
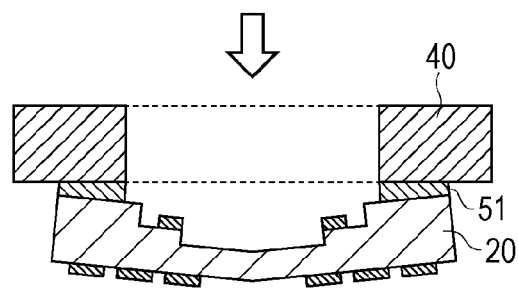
Figure 10C:
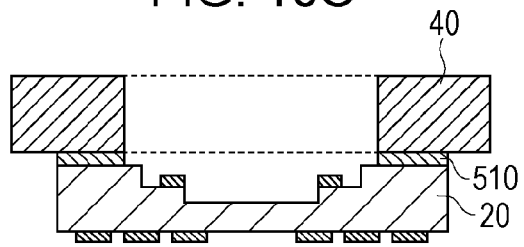
Figure 10D:
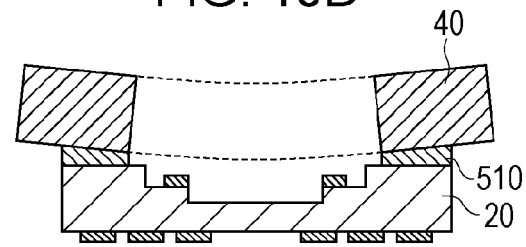
Figure 10D:
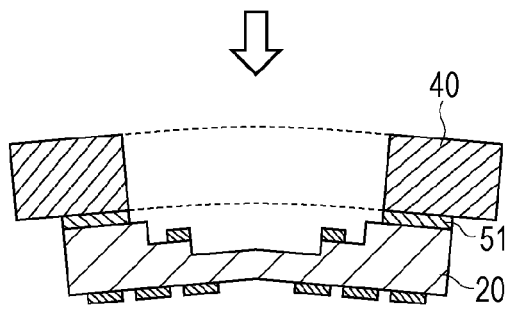
Figure 10D:
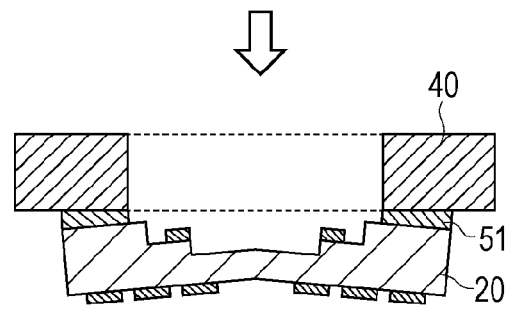

FIGS. 10A to 10D are sectional views explaining warping of the frame body 40 when the mounting member 24 is fabricated. An arrow in each of FIGS. 10A to 10D indicates a change in state in the process of bonding the base body 20 and the frame body 40 shown in FIGS. 5B and 5C. A state before the arrow indicates a state at a low temperature (room temperature) before the adhesive 510 is hardened. A state after the arrow indicates a state at a low temperature after the adhesive 510 is hardened (after the jointing material 51 is formed). FIGS. 10A and 10B each show a case when $\alpha_F > \alpha_B$. FIGS. 10C and 10D each show a case when $\alpha_B > \alpha_F$. FIGS. 10A and 10C each show a form in which the frame body 40 is flat before the bonding. FIGS. 10B and 10D show a form in which the frame body 40 warps before the bonding.

The warping direction of the frame body 40 with respect to the base body 20 before the bonding is determined based on the relationship between the degrees of the thermal expansion coefficients of the frame body 40 and the base body 20. If the thermal expansion coefficient of the frame body 40 is higher than the thermal expansion coefficient of the base body 20, as shown in FIG. 10B, the frame body 40 and the base body 20 are superposed so that the frame body 40 protrudes toward the side opposite to the base body 20. In contrast, if the thermal expansion coefficient of the frame body 40 is lower than the thermal expansion coefficient of the base body 20, as shown in FIG. 10D, the frame body 40 and the base body 20 are superposed so that the frame body 40 protrudes toward the side of the base body 20. Accordingly, the warping of the frame body 40 is decreased during the cooling as compared with the warping when being superposed. Hence, the mounting member 24 including the frame body 40 with high flatness can be obtained. The decrease of the warping includes a process in which the warping amount is decreased and the warping approaches the flat state. If the frame body 40 is previously deformed (warps) in a direction opposite to a direction of deformation that is generated at the frame body 40 during the cooling, the deformation during the cooling can be absorbed.

When the cooling is ended, the frame body 40 may warp in a direction opposite to a warping direction before the bonding. That is, the frame body 40 warping to protrude toward the side opposite to the base body 20 before the heating as shown in FIG. 10B may warp toward the side of the base body 20 after the cooling. Alternatively, the frame body 40 warping to protrude toward the base body 20 before the heating as shown in FIG. 10D may warp toward the side opposite to the base body 20 after the cooling. In this process, the warping amount of the frame body 40 is decreased and becomes temporarily flat at a certain temperature that is at least higher than the room temperature. If the frame body 40 is further cooled, the warping in the opposite direction is generated at the frame body 40. If the warping in the opposite direction is generated at the frame body 40 after the bonding, the warping amount in the opposite direction after the bonding is desirably smaller than the warping amount of the frame body 40 before the bonding. However, the warping amount in the opposite direction after the bonding may be larger than the warping amount before the bonding, because in the case in which the warping in the opposite direction is generated, the warping amount after the bonding can be decreased since the frame body 40 warps before the bonding, as compared with the frame body 40 does not warp before the bonding.

A change in warping of the frame body 40 is described. In the cooling step, contraction is generated in the cooling process in accordance with the thermal expansion coefficients of the base body 20 and the frame body 40, from a high temperature state during the heating. As described above, since the frame body 40 has the higher thermal expansion coefficient than that of the base body 20 in this example, the contraction amount of the frame body 40 is larger than the contraction amount of the base body 20. Since the frame body 40 and the base body 20 are fixed to each other in a high temperature state, the frame body 40 is deformed in a direction to approach the flat state so that the difference between the contraction amounts of the base body 20 and the frame body 40 is reduced. If the difference between the contraction amounts of the base body 20 and the frame body 40 is large, a possibility that the frame body 40 warps in the opposite direction is increased. The base body 20 may warp as the result that the warping of the frame body 40 is decreased. More specifically, the base body 20 warps after the cooling in the direction opposite to the warping direction of the frame body 40 before the heating. For example, if the frame body 40 warps to protrude toward the side opposite to the base body 20 before the heating, the base body 20 may warp to protrude toward the side opposite to the frame body 40 after the cooling. The warping which may be generated at the base body 20 after the cooling may be smaller if the frame body 40 warps before the bonding, as compared with a case in which the frame body 40 does not warp before the bonding (FIGS. 10A, 10C). Hence, the flatness of the electronic component 100 and the electronic module 600 can be further increased.

The warping of the frame body 40 is described in detail. The frame body 40 in this example is a quadrilateral. The sides of the frame body 40 include strip-shaped portions (strip portions) interposed between the outer edge 405 of the frame body 40 and the sides of the inner edge 403 of the quadrilateral frame body 40. Further, each of the sides of the frame body 40 includes two corner portions shared by the adjacent sides at both sides of the strip portions. Hence, the quadrilateral frame body 40 includes four corner portions and four strip portions. Regarding a single side, a portion of a strip portion located between two corner portions is an intermediate portion. If the frame body 40 has a protruding warp, when the frame body 40 is mounted on a flat surface (reference surface) such as a base, the distance between the reference surface and the intermediate portion is larger than the distance between the reference surface and each of the two corner portions. When the frame body 40 is mounted on the base body 20, the joint surface of the base body 20 with respect to the frame body 40 may be considered as the reference surface. The warping amount is expressed by a difference between an average value of the distances from the reference surface to the two corner portions, and the distance from the reference surface to the intermediate portion.

If at least one of the sides of the frame body 40 has warping, the frame body 40 is assumed to have warping. At least a pair of two opposite sides desirably has warping in similar directions. If the frame body 40 has short sides and long sides, at least the long sides desirably have warping. At least the opposite long sides desirably have warping in similar directions. Also, warping amounts of the two opposite long sides are desirably smaller than warping amounts of the two opposite short sides. This is because the contraction amounts of the long sides during the cooling are larger than those of the short sides.

The warping amount of the frame body 40 is desirably smaller than the thickness of the frame body 40. If the frame body 40 has extremely large warping that exceeds the thickness of the frame body 40, application of the adhesive 510 to the frame body 40 may become difficult, or bonding between the base body 20 and the frame body 40 may become difficult. The thickness of the frame body 40 is a distance between the lower joint surface 401, which is bonded to the base body 20, and the upper joint surface 402, which is a surface opposite to the joint surface 401 and is bonded to the lid body 30. Although the thickness of the frame body 40 in this example is not substantially changed between the corner portion and the intermediate portion, the thickness of the frame body 40 at each side is expressed by an average value of the thicknesses at the two corner portions and the thickness of the intermediate portion at each side. To obtain an effect in practical use, the warping amount is desirably at least $1/100$ of the thickness at each side. Even if the warping amount is $1/10$ or smaller of the thickness, a sufficient effect can be obtained.

Also, the warping amount is in a range from 30 to 80 µm for practical use. If the warping amount before the bonding is smaller than 20 µm, after the bonding to the base body 20, a possibility that the warping amount in the opposite direction generated at the frame body 40 of the mounting member 24 becomes large is increased. Also, if the warping amount is larger than 80 µm, the application height of the adhesive 520 for bonding the base body 20 and the intermediate portions of the respective sides of the frame body 40 has to be sufficient. Hence, defective bonding may likely occur. Also, if the warping amount is too large, productivity is likely decreased such that handling for the frame body 40 by suction may be difficult. Further, if the warping amount is too large, even after the warping is decreased, the warping amount of the upper side of the frame body 40 of the mounting member 24 is not sufficiently decreased. Hence, the flatness is decreased.

The shape of the warping is not particularly limited. The warping may have an arcuate shape entirely in the length direction of the side. This shape can be formed by correction using a leveler or by bending. The shape may not be the arcuate shape. The warping may have a shape in which a shape from the corner portion to a center portion is linear and the center portion is bent. For example, the shape can be formed by setting a supporting point at a position near the center of the side and bending the side from both ends of the side. Also, an area near the center portion of the side may be bulged. This shape can be formed by pushing an area near the center portion of the side upward while areas near both ends of the side are held.

EXAMPLE

Hereinafter, an example of the present invention is described. The electronic component 100 shown in FIGS. 2A and 2B was fabricated. The electronic component 100 has a rectangular plate shape with the X direction being the long-side direction and the Y direction being the short-side direction.

In the electronic component 100, the rectangular concave base body 20 having the three layers stacked was prepared. In the base body 20, the thickness of the plate-shaped first layer 21 is 0.8 mm, the thickness of the frame-shaped second layer 22 (the height of the step part 201) is 0.4 mm, and the thickness of the frame-shaped third layer 23 (the height of the step part 203) is 0.2 mm. The outer diameter of the first layer 21 in the X direction is 32.0 mm. The outer diameter of the first layer 21 in the Y direction is 26.4 mm. The outer diameter of the second layer 22 in the X direction is 32.0 mm, and the inner diameter thereof is 26.2 mm (the frame width thereof is 2.9 mm). The outer diameter of the second layer 22 in the Y direction is 26.4 mm, and the inner diameter thereof is 19.6 mm (the frame width thereof is 3.4 mm). The outer diameter of the third layer 23 in the X direction is 32.0 mm, and the inner diameter thereof is 26.2 mm (the frame width thereof is 2.9 mm). The outer diameter (corresponding to $D_{BO}$) of the third layer 23 in the Y direction is 26.4 mm, and the inner diameter (corresponding to $D_{BI}$) thereof is 21.4 mm (the frame width thereof is 2.5 mm). The width in the Y direction of the fiducial stage part 202 provided with the inner terminals 5 is 0.9 mm.

The inner terminals 5 and the outer terminals 7 each use a laminate film in which gold plating is applied to a nickel base. The outer terminals 7 are LGA type, and 125 outer terminals 7 are provided.

Next, the frame body 40 was prepared, and thermosetting resin as the adhesive 510 was applied on one surface of the frame body 40 by screen printing. Then, the frame body 40 was mounted on the upper stage part 204 of the base body 20, and a pressure was applied. The pressure was adjusted so that the thickness of the thermosetting resin was in a range from 10 to 50 µm. Then, heat at temperatures in a range from about 120° C. to 150° C. was applied, and thus the thermosetting resin as the adhesive 510 was hardened. To increase an adhesive force to the thermosetting resin, the surfaces of the frame body 40 were processed by sandblasting to obtain a surface roughness Ra in a range from about 0.1 to 0.2 µm, and thus roughness was applied to the front surface. The thickness of the frame body 40 is 0.8 mm, the outer diameter in the X direction thereof is 42.0 mm (in the outer diameter, the widths of the extension parts 404 provided at the left side and right side are each 4.5 mm), and the inner diameter thereof is 27.4 mm. The outer diameter of the frame body 40 in the Y direction is 27.4 mm, and the inner diameter thereof is 22.6 mm. At this time, the offset distance between the inner edge 403 of the frame body 40 and the step part 203 of the base body 20 was 0.60 mm at each of the left side and right side in the X direction, and 0.60 mm at each of the upper side and lower side in the Y direction. Since the inner edge 403 is larger than the step part 203, the entire circumference of the inner edge 403 is located at the outer side of the step part 203 (at the side of the outer edge 205). Also, the frame body 40 protrudes with respect to the outer edge 205 of the base body 20 by 0.50 mm at minimum and 5.0 mm at maximum (corresponding to the extension part 404) at each of the left side and right side in the X direction, and protrudes by 0.50 mm at each of the upper side and lower side in the Y direction. Since the outer edge 405 is larger than the outer edge 205, the entire circumference of the outer edge 405 is located at the outer side of the outer edge 205 (at the side of the outer edge 205). In this way, the mounting member 24 is obtained.

Next, a CMOS image sensor with so-called advanced photo system type-C (APS-C) size was prepared as the electronic device 10. The outer diameter of the electronic device 10 in the Y direction is 18.0 mm, and the thickness thereof is 0.75 mm. The thermal expansion coefficient of the electronic device 10 mainly made of silicon may be assumed as 2.5 ppm/k. This electronic device 10 was fixed by thermosetting substantially at the center of the base body 20, by using the adhesive 520, which was a black die bonding adhesive. Then, the electrodes 3 and the inner terminals 5 provided at the peripheral region of the chip were electrically connected by metal wires with use of a wire bonding apparatus. The distance between the outer edge 105 of the electronic device 10 and the inner edge 403 of the frame body 40 is 1.5 mm in the X direction, and 2.3 mm (corresponding to $D_{CF}$) in the Y direction. Also, the distance between the electronic device 10 and the step part 203 is 0.9 mm in the X direction, and 1.7 mm in the Y direction. The distance $D_{CT}$ between the inner terminals 5 and the outer edge 105 of the electronic device 10 was 0.8 mm.

Next, an α-ray proofed plate member with a thickness of 0.5 mm was prepared as the lid body 30. The dimension in the X direction of the lid body 30 is 31.8 mm and the dimension in the Y direction thereof is 26.3 mm. The dimensions substantially correspond to the outer diameter of the base body 20. Ultraviolet-curable resin was applied as the adhesive 530 in a frame shape on one surface of the lid body 30 by a dispenser, the lid body 30 was mounted on the frame body 40 such that the surface applied with the adhesive 530 faces the joint surface 402 of the frame body 40, and a proper pressure was applied. At this time, the spherical particles as spacers each having a diameter of 30 µm were mixed in the adhesive 530, and the thickness of the adhesive 530 was about 30 µm. At this time, it was found that the adhesive 530 protruded from between the lid body 30 and the frame body 40. Then, ultraviolet rays were emitted through the lid body 30 and hence photo-curing processing was performed. Further, as post-hardening, thermosetting processing was performed to harden the adhesive 530, and thus the jointing material 53 was formed. The distance between the front surface 101 of the electronic device 10 and the inner surface 302 of the lid body 30 was 0.75 mm. In this way, the electronic component 100 with a thickness of 2.8 mm is obtained.

Then, the wiring member 500 with a certain size was prepared, the solder paste 80 was applied by printing onto the connection terminals 9 of the wiring member 500, the solder paste 80 was molten in a reflow oven, and thus the electronic component 100 was fixed to the wiring member 500. In this way, the electronic module 600 (an image pickup module) is obtained.

Electronic modules 600 fabricated as described above were fabricated in 32 ways in which the materials of the base body 20, lid body 30, frame body 40, and wiring member 500 were changed, and the 32 types of the electronic modules 600 were fabricated by 10 each. Then, the warping state of the base body 20 during the manufacturing process, the warping state of the electronic device 10, and a matter resulted from the state were evaluated for each electronic module 600.

Table 1 shows the study result relating to the 32 combinations of Sample No. 1 to Sample No. 32, in which the thermal expansion coefficient $\alpha_L$ of the lid body 30, the thermal expansion coefficient $\alpha_F$ of the frame body 40, the thermal expansion coefficient $\alpha_B$ of the base body 20, and the thermal expansion coefficient $\alpha_C$ of the wiring member 500 are changed and the combinations thereof are changed.

The thermal expansion coefficient $\alpha_L$ of the lid body 30, the thermal expansion coefficient $\alpha_F$ of the frame body 40, the thermal expansion coefficient $\alpha_B$ of the base body 20, and the thermal expansion coefficient $\alpha_C$ of the wiring member 500 are indicated. Regarding the thermal expansion coefficient $\alpha_L$ of the lid body 30, quartz crystal is 13, different types of glasses are 8.5, 6.6, and 3.3. Regarding the thermal expansion coefficient $\alpha_F$ of the frame body 40, SUS430 is 10.3, SUS304 is 17.3, aluminum is 23.1, 42 alloy is 4.3, and Kovar is 5.2. Regarding the thermal expansion coefficient $\alpha_B$ of the base body 20, a ceramic of aluminum oxide (alumina) is 7.1, and a ceramic of aluminum nitride is 4.6. A glass epoxy substrate which is a rigid printed wiring board was used for the wiring member 500. Regarding the thermal expansion coefficient $\alpha_C$, substrates of 20 and 15 were prepared. The unit of these thermal expansion coefficients (linear expansion coefficients) is ppm/K ($=10^{-6}/°$ C.).

In the column for Condition 1, ○ (circle) is given if Condition 1 ($\alpha_L < \alpha_F$) that the thermal expansion coefficient $\alpha_L$ of the lid body 30 is lower than the thermal expansion coefficient $\alpha_F$ of the frame body 40 is satisfied, and x (cross) is given if Condition 1 is not satisfied. In the column for Condition 2, ○ (circle) is given if Condition 2 ($\alpha_F > \alpha_B$) that the thermal expansion coefficient $\alpha_F$ of the frame body 40 is higher than the thermal expansion coefficient $\alpha_B$ of the base body 20 is satisfied, and x (cross) is given if Condition 2 is not satisfied. Also, the difference (absolute value) between the thermal expansion coefficient $\alpha_F$ of the frame body 40 and the thermal expansion coefficient $\alpha_B$ of the base body 20 is indicated. In the column for Condition 3, ○ (circle) is given if Condition 3 ($\alpha_L < \alpha_B$) that the thermal expansion coefficient $\alpha_L$ of the lid body 30 is lower than the thermal expansion coefficient $\alpha_B$ of the base body 20 is satisfied, and x (cross) is given if Condition 3 is not satisfied. In the column for Condition 4, ○ (circle) is given if Condition 4 ($\alpha_F < \alpha_C$) that the thermal expansion coefficient $\alpha_F$ of the frame body 40 is lower than the thermal expansion coefficient $\alpha_C$ of the wiring member 500 is satisfied, and x (cross) is given if Condition 4 is not satisfied.

In the column for Phase 1, the warping state of the base body 20 of the mounting member 24 in the phase that the mounting member 24 is fabricated as shown in FIG. 5C is measured by a coordinate measuring machine, and an upper warp shape or a lower warp shape is indicated. In the column for Phase 2, the warping state of the electronic device 10 of the electronic component 100 in the phase that the electronic component 100 is fabricated as shown in FIG. 6G is indicated. In the column for Phase 3, the warping state of the electronic device 10 in the phase that the electronic module 600 is fabricated as shown in FIG. 7I is indicated. For the evaluation of the warping of the electronic device 10, the warping amount of the electronic device 10 was measured by a laser displacement gauge from above the lid body 30, and the flatness of the electronic device 10 was measured. For the flatness of the electronic device 10, the distances between the four corners of the electronic device 10 and the center portion of the electronic device 10 was measured, and the difference between the maximum value and the minimum value was used as the flatness. A flatness of 10 μm or smaller was judged as the flat state, and other flatness was judged as the upper warp shape or the lower warp shape.

In an example of Sample No. 11, in which the lid body 30 is quartz crystal (thermal expansion coefficient: 13), the frame body 40 is SUS430 (thermal expansion coefficient: 10.3), the base body 20 is an aluminum oxide ceramic (thermal expansion coefficient: 7.1), and the wiring member 500 is glass epoxy (thermal expansion coefficient: 20), the following result is obtained. The warping degree of the base body 20 in Phase 1 and Phase 2 are respectively 40 μm and 50 μm. The warping degree of the electronic device 10 in Phase 2 and Phase 3 are respectively 30 μm and 9 μm.

The column for Evaluation 1 shows the result of an open/short electrical test for electrical connection with the connection conductors 8 (solder) between the wiring member 500 and the electronic component 100. For each combination, the number of good products from among each fabricated 10 samples is indicated. Then, ○ (circle) is given if the number of good products is 10 (all samples), Δ (triangle) is given if the number of good products is 5 to 9, and x (cross) is given if the number of good products is 1 to 4.

The column for Evaluation 2 shows the result of focus adjustment when the electronic device 10 (CMOS sensor) is installed in a camera. More specifically, an image pickup unit serving as the fabricated electronic module 600 was installed in a prepared camera, and was mounted on the camera. The image pickup unit was mounted while the XYθ axes of the electronic device 10 were appropriately adjusted so that the focus met the CMOS sensor and a flange back distance from a mount surface of the camera was within a range of certain values. Judgment was made as follows. A sample that the focus adjustment could be made for the entire surface of an image pickup surface of the electronic device 10 was judged as being passed and a sample that the focus adjustment could not be made because of large warping of a chip was judged as being rejected. For each combination, the number of passed products from among each fabricated 10 samples is indicated. Then, ○ (circle) is given if the number of passed products is 10 (all samples), Δ (triangle) is given if the number of passed products is 5 to 9, and x (cross) is given if the number of passed products is 1 to 4.

TABLE 1

| No | $\alpha_L$ | $\alpha_F$ | $\alpha_B$ | $\alpha_C$ | Condition 1 | Condition 2 | Condition 3 | Condition 4 | Phase 1 | Phase 2 | Phase 3 | Evaluation 1 | Evaluation 2 |
|---|---|---|---|---|---|---|---|---|---|---|---|---|---|
| 1 | 8.5 | 10.3 | 7.1 | 20 | ○ | ○3.2 | x | ○ | Lower warp | Lower warp | Flat | ○10 | ○10 |
| 2 | 6.6 | 10.3 | 7.1 | 20 | ○ | ○3.2 | ○ | ○ | Lower warp | Lower warp | Flat | ○10 | ○10 |
| 3 | 3.0 | 10.3 | 7.1 | 20 | ○ | ○3.2 | ○ | ○ | Lower warp | Lower warp | Flat | ○10 | ○10 |
| 4 | 13.0 | 17.3 | 7.1 | 20 | ○ | ○10.2 | x | ○ | Lower warp | Lower warp | Flat | ○10 | ○10 |
| 5 | 8.5 | 17.3 | 7.1 | 20 | ○ | ○10.2 | x | ○ | Lower warp | Lower warp | Flat | ○10 | ○10 |
| 6 | 6.6 | 17.3 | 7.1 | 20 | ○ | ○10.2 | ○ | ○ | Lower warp | Lower warp | Flat | ○10 | ○10 |
| 7 | 3.0 | 17.3 | 7.1 | 20 | ○ | ○10.2 | ○ | ○ | Lower warp | Lower warp | Flat | ○10 | ○10 |
| 8 | 8.5 | 10.3 | 7.1 | 15 | ○ | ○3.2 | x | ○ | Lower warp | Lower warp | Flat | ○10 | ○10 |
| 9 | 6.6 | 10.3 | 7.1 | 15 | ○ | ○3.2 | ○ | ○ | Lower warp | Lower warp | Flat | ○10 | ○10 |
| 10 | 3.0 | 10.3 | 7.1 | 15 | ○ | ○3.2 | ○ | ○ | Lower warp | Lower warp | Flat | ○10 | ○10 |
| 11 | 13.0 | 10.3 | 7.1 | 20 | x | ○3.2 | x | ○ | Lower warp | Lower warp | Flat | Δ9 | ○10 |
| 12 | 13.0 | 10.3 | 7.1 | 15 | x | ○3.2 | x | ○ | Lower warp | Lower warp | Flat | Δ9 | ○10 |
| 13 | 13.0 | 17.3 | 4.6 | 20 | ○ | ○12.7 | x | ○ | Lower warp | Lower warp | Flat | Δ8 | ○10 |
| 14 | 8.5 | 17.3 | 4.6 | 20 | ○ | ○12.7 | x | ○ | Lower warp | Lower warp | Flat | Δ8 | ○10 |
| 15 | 6.6 | 17.3 | 4.6 | 20 | ○ | ○12.7 | x | ○ | Lower warp | Lower warp | Flat | Δ8 | ○10 |
| 16 | 3.0 | 17.3 | 4.6 | 20 | ○ | ○12.7 | ○ | ○ | Lower warp | Lower warp | Flat | Δ8 | ○10 |
| 17 | 13.0 | 5.2 | 7.1 | 20 | x | x1.9 | x | ○ | Upper warp | Flat | Upper warp | ○10 | Δ9 |
| 18 | 13.0 | 5.2 | 7.1 | 15 | x | x1.9 | x | ○ | Upper warp | Flat | Upper warp | ○10 | Δ9 |
| 19 | 13.0 | 4.3 | 7.1 | 20 | x | x2.8 | x | ○ | Upper warp | Flat | Upper warp | ○10 | Δ8 |
| 20 | 8.5 | 5.2 | 7.1 | 15 | x | x1.9 | x | ○ | Upper warp | Flat | Upper warp | ○10 | Δ8 |
| 21 | 8.5 | 4.3 | 7.1 | 20 | x | x2.8 | x | ○ | Upper warp | Flat | Upper warp | ○10 | Δ7 |
| 22 | 8.5 | 5.2 | 7.1 | 20 | x | x1.9 | x | ○ | Upper warp | Flat | Upper warp | ○10 | Δ7 |
| 23 | 6.6 | 5.2 | 7.1 | 15 | x | x1.9 | ○ | ○ | Upper warp | Upper warp | Upper warp | ○10 | Δ7 |
| 24 | 6.6 | 4.3 | 7.1 | 20 | x | x2.8 | ○ | ○ | Upper warp | Upper warp | Upper warp | ○10 | Δ6 |
| 25 | 6.6 | 5.2 | 7.1 | 20 | x | x1.9 | ○ | ○ | Upper warp | Upper warp | Upper warp | ○10 | Δ5 |
| 26 | 3.0 | 5.2 | 7.1 | 15 | ○ | x1.9 | ○ | ○ | Upper warp | Upper warp | Upper warp | Δ8 | Δ7 |
| 27 | 3.0 | 5.2 | 7.1 | 20 | ○ | x1.9 | ○ | ○ | Upper warp | Upper warp | Upper warp | Δ8 | x3 |
| 28 | 3.0 | 4.3 | 7.1 | 20 | ○ | x2.8 | ○ | ○ | Upper warp | Upper warp | Upper warp | Δ7 | x4 |
| 29 | 6.6 | 23.1 | 7.1 | 20 | ○ | ○16.0 | ○ | x | Lower warp | Lower warp | Lower warp | x2 | x3 |
| 30 | 3.0 | 23.1 | 7.1 | 20 | ○ | ○16.0 | ○ | x | Lower warp | Lower warp | Lower warp | x2 | x3 |

TABLE 1-continued

| No | $\alpha_L$ | $\alpha_F$ | $\alpha_B$ | $\alpha_C$ | Condition 1 | Condition 2 | Condition 3 | Condition 4 | Phase 1 | Phase 2 | Phase 3 | Evaluation 1 | Evaluation 2 |
|---|---|---|---|---|---|---|---|---|---|---|---|---|---|
| 31 | 8.5 | 23.1 | 7.1 | 20 | ○ | ○16.0 | x | x | Lower warp | Lower warp | Lower warp | x2 | x2 |
| 32 | 13.0 | 23.1 | 7.1 | 20 | ○ | ○16.0 | x | x | Lower warp | Lower warp | Lower warp | x2 | x1 |

The results of Table 1 are described. First, for Samples No. 1 to 16, and 29 to 32 that satisfy Condition 2 each have the lower warp shape in Phases 1 and 2 regardless of Conditions 1 and 3. It was found that Samples No. 1 to 16 that satisfy Condition 4 from among the above samples were flattened in Phase 3. In contrast, Samples No. 29 to 32 that did not satisfy Condition 4 each continuously had the lower warp shape in Phase 3. Consequently, unsatisfactory evaluations were made in Evaluation 1 and Evaluation 2.

From among Samples No. 1 to 16 with good results in Evaluation 2, regarding each of Samples No. 1 to 10 that obtained good results in Evaluation 1, the difference (absolute value) between the thermal expansion coefficient $\alpha_F$ of the frame body 40 and the thermal expansion coefficient $\alpha_B$ of the base body 20 is 10.2 or smaller in Condition 2. In contrast, regarding each of Samples No. 13 to 16, the difference between the thermal expansion coefficient $\alpha_F$ and the thermal expansion coefficient $\alpha_B$ of the base body 20 is larger than 10.2. Hence, it is understood that the results of Evaluation 1 are worse than those of Samples No. 1 to 10. Therefore, it can be said that the difference between the thermal expansion coefficient $\alpha_F$ and the thermal expansion coefficient $\alpha_B$ of the base body 20 is desirably 10.2 or smaller. Also, Samples No. 11 and 12 that do not satisfy Condition 1 meet the relationship (iii) $\alpha_B < \alpha_F < \alpha_L < \alpha_C$. It can be understood that the results in Evaluation 1 of Samples No. 11 and 12 are slightly worse than those of Samples No. 1 to 10 that meet the relationship (i) or (ii). When the warping state is more specifically checked for Samples No. 11 and 12, the warping is increased from Phase 1 to Phase 2 in each of Samples No. 11 and 12, whereas the warping is decreased from Phase 1 to Phase 2 in each of Samples No. 1 to 10. Therefore, it is desirable to satisfy Condition 1.

Samples No. 17 to 28 that do not satisfy Condition 2 each have the upper warp shape in Phase 1. From among these samples, good results were obtained in Evaluation 1 in any of Samples No. 17 to 25 that do not satisfy Condition 1. In contrast, in each of Samples No. 26 to 28 that satisfy Condition 1, the result of Evaluation 1 was slightly degraded. This may be because, since the thermal expansion coefficient is decreased from the base body 20 to the lid body 30, the warping degree with the upper warp shape is larger than the warping in any of Samples No. 17 to 25. Also, Samples No. 17 to 22 that do not satisfy Condition 3 are flat in Phase 2, and the results of Evaluation 2 tend to be better than those of Samples No. 23 to 25 that satisfy Condition 3. Any of the electronic modules 600 of Samples No. 17 to 28 warps in the upper warp shape in Phase 3, because the warping with the upper warp shape in Phase 3 may be decreased as being flat in Phase 2.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103828 filed Apr. 27, 2012 and No. 2013-039449 filed Feb. 28, 2013, which are hereby incorporated by reference herein in their entirety.

What is claimed is:

1. A manufacturing method of an electronic component including an electronic device and a package that houses the electronic device and is for being fixed to a wiring member by reflow soldering, the method comprising:
   preparing a mounting member, the mounting member being formed by bonding a base body having a center region and a peripheral region that encloses the center region of the base body, and a frame body having an opening corresponding to the center region of the base body, between the frame body and the peripheral region of the base body;
   fixing an electronic device to the center region of the base body; and
   arranging a lid body having a center region and a peripheral region that encloses the center region so that the center region of the lid body faces the electronic device, and bonding the peripheral region of the lid body and the frame body,
   wherein the mounting member has an inner terminal for being electrically connected, to the electronic device, and an outer terminal for being fixed to the wiring member, and a part embedded in the base body for an electrical connection between the inner terminal and the outer terminal, and
   wherein one of conditions (a), (b) and (c) is satisfied $$\alpha_B < \alpha_F < \alpha_C, \text{ and } \alpha_L < \alpha_F < \alpha_C, \tag{a}$$

$$\alpha_F < \alpha_B < \alpha_C, \text{ and } \alpha_F < \alpha_L < \alpha_C, \text{ and} \tag{b}$$

$$\alpha_B < \alpha_F < \alpha_C, \text{ and } \alpha_F < \alpha_L < \alpha_C, \tag{c}$$

where $\alpha_L$ is a thermal expansion coefficient of the lid body in the peripheral region of the lid body, $\alpha_F$ is a thermal expansion coefficient of the frame body, $\alpha_B$ is a thermal expansion coefficient of the base body in the peripheral region of the base body, and $\alpha_C$ is a thermal expansion coefficient of the wiring member.

2. The manufacturing method of the electronic component according to claim 1, wherein a condition $\alpha_L < \alpha_F$ is satisfied.

3. A manufacturing method of an electronic component including an electronic device and a package that houses the electronic device, and is for being fixed to a wiring member by reflow soldering, the method comprising:
   preparing a mounting member, the mounting member being formed by bonding a base body having a center region and a peripheral region that encloses the center region of the base body, and a frame body having an opening corresponding to the center region of the base body, between the frame body and the peripheral region of the base body;
   fixing an electronic device to the center region of the base body; and
   arranging a lid body having a center region and a peripheral region that encloses the center region so that the center region of the lid body faces the electronic device, and bonding the peripheral region of the lid body and the frame body, wherein a condition $\alpha_L<\alpha_B$, a condition $\alpha_B<\alpha_F<\alpha_C$, and a condition $\alpha_L<\alpha_C$ are satisfied, where $\alpha_L$ is a thermal expansion coefficient of the lid body, $\alpha_F$ is a thermal expansion coefficient of the frame body, $\alpha_B$ is a thermal expansion coefficient of the base body, and $\alpha_C$ is a thermal expansion coefficient of the wiring member.

4. The manufacturing method of the electronic component according to claim 1, wherein the base body is ceramic, and wherein the lid body is quartz crystal or glass.

5. The manufacturing method of the electronic component according to claim 1, wherein a difference between $\alpha_B$ and $\alpha_L$ is 10.2 ppm/K or less.

6. The manufacturing method of the electronic component according to claim 1, wherein $\alpha_C$ is 25 ppm/K or less.

7. The manufacturing method of the electronic component according to claim 1, wherein a condition $\alpha_D<\alpha_B$, a condition $\alpha_D<\alpha_L$, and a condition $\alpha_D<\alpha_F$ are satisfied, where $\alpha_D$ is a thermal expansion coefficient of the electronic device.

8. A manufacturing method of an electronic component including an electronic device and a package that houses the electronic device, and is forte being fixed to a wiring member by reflow soldering, the method comprising:

preparing a mounting member, the mounting member being formed by bonding a base body having a center region and a peripheral region that encloses the center region of the base body, and a frame body having an opening corresponding to the center region of the base body, between the frame body and the peripheral region of the base body;

fixing an electronic device to the center region of the base body; and arranging a lid body having a center region and a peripheral region that encloses the center region so that the center region of the lid body faces the electronic device, and bonding the peripheral region of the lid body and the frame body, wherein a condition $\alpha_B<\alpha_F<\alpha_C$, and a condition $\alpha_L<\alpha_C$ are satisfied, where $\alpha_L$ is a thermal expansion coefficient of the lid body, $\alpha_F$ is a thermal expansion coefficient of the frame body, $\alpha_B$ is a thermal expansion coefficient of the base body, and $\alpha_C$ is a thermal expansion coefficient of the wiring member, wherein the frame body is metal, and wherein the base body is ceramic.

9. The manufacturing method of the electronic component according to claim 1, wherein the step of preparing includes a phase of heating the base body and the frame body in a state in which an adhesive is interposed between the peripheral region of the base body and the frame body, and a phase of cooling the base body and the frame body after the adhesive is solidified.

10. The manufacturing method of the electronic component according to claim 9, wherein the frame body has a warping in the state, and the warping of the frame body is decreased in the cooling phase.

11. The manufacturing method of the electronic component according to claim 1, wherein the peripheral region of the lid body and the frame body are bonded by using photo-curable resin, and then the photo-curable resin is hardened by thermosetting.

12. The manufacturing method of the electronic component according to claim 1, wherein the electronic device is bonded to the center region of the base body by using thermosetting resin.

13. The manufacturing method of the electronic component according to claim 1, wherein the electronic device is an image pickup device.

14. A manufacturing method of an electronic module, the method comprising fixing an electronic component that is manufactured by the manufacturing method of the electronic component according to claim 1, to a wiring member by reflow soldering.

15. The manufacturing method of the electronic module according to claim 14, wherein the wiring member is a rigid substrate.

16. A manufacturing method of a mounting member having an inner terminal for being electrically connected, to the electronic device, and an outer terminal for being fixed to the wiring member, comprising:

preparing a base body having a center region and a peripheral region that encloses the center region of the base body, a part being embedded in the base body for an electrical connection between the inner terminal and the outer terminal;

preparing a frame body having an opening; and bonding the frame body to the peripheral region of the base body so that the opening corresponds to the center region of the base body, wherein the step of bonding includes:

a phase of heating the base body and the frame body in a state in which an adhesive is interposed between the peripheral region of the base body and the frame body, and a phase of cooling the base body and the frame body after the adhesive is solidified, wherein the frame body is metal, and the base body is ceramic, and wherein the frame body has a higher thermal expansion coefficient than a thermal expansion coefficient of the base body in the peripheral region of the base body.

17. A manufacturing method of an electronic component, comprising:

preparing a mounting member, the mounting member including a base body having a center region and a peripheral region that encloses the center region of the base body, and a frame body having an opening corresponding to the center region of the base body, the base body and the frame body are bonded between the frame body and the peripheral region of the base body;

fixing an electronic device to the center region of the base body; and arranging a lid body having a center region and a peripheral region that encloses the center region so that the center region of the lid body faces the electronic device, and bonding the peripheral region of the lid body and the frame body, wherein the mounting member has an inner terminal for being electrically connected, to the electronic device, and an outer terminal for being fixed to the wiring member, and a part embedded in the base body for an electrical connection between the inner terminal and the outer terminal, wherein the frame body is metal, and the lid body is quartz crystal or glass, and wherein one of conditions (x), (y) and (z) is satisfied $$\alpha_B < \alpha_F, \text{ and } \alpha_L < \alpha_F, \quad (x)$$

$$\alpha_F < \alpha_B, \text{ and } \alpha_F < \alpha_L, \text{ and} \quad (y)$$

$$\alpha_B < \alpha_F, \text{ and } \alpha_F < \alpha_L, \quad (z)$$

where $\alpha_L$ is a thermal expansion coefficient of the lid body in the peripheral region of the lid body, $\alpha_F$ is a thermal expansion coefficient of the frame body, $\alpha_B$ is a thermal expansion coefficient of the base body in the peripheral region of the base body.

18. The electronic component according to claim 17, wherein the thermal expansion coefficient of the lid body is lower than at least one of the thermal expansion coefficient of the base body and the thermal expansion coefficient of the frame body.

19. A manufacturing method of an electronic module, comprising:
preparing a electronic component;
preparing a wiring member; and
fixing the electronic component to the wiring member by reflow soldering,
wherein the electronic component comprises:
a base body having a center region and a peripheral region that encloses the center region of the base body;
a frame body having an opening corresponding to the center region of the base body, and bonded to the peripheral region of the base body;
an electronic device fixed to the center region of the base body;
a lid body having a center region and a peripheral region that encloses the center region, the lid body is arranged so that the center region of the lid body faces the electronic device, and the peripheral region of the lid body is bonded to the frame body; and
an inner terminal for being electrically connected, to the electronic device;
an outer terminal for being fixed to the wiring member; and
a part embedded in the base body for an electrical connection between the inner terminal and the outer terminal,
wherein the thermal expansion coefficient of the base body, the thermal expansion coefficient of the frame body, and the thermal expansion coefficient of the lid body are lower than a thermal expansion coefficient of the wiring member, and
wherein the base body has a warping before the step of fixing, and the warping of the base body is decreased after the step of fixing.

20. The manufacturing method of the electronic module according to claim 19, wherein the base body is ceramic, the frame body is metal, the lid body is quartz crystal or glass, and the wiring member is a rigid substrate.

* * * * *